(12) United States Patent
Endres et al.

(10) Patent No.: US 9,891,530 B2
(45) Date of Patent: Feb. 13, 2018

(54) ILLUMINATION OPTICAL UNIT

(71) Applicant: Carl Zeiss SMT GmbH, Oberkochen (DE)

(72) Inventors: Martin Endres, Koenigsbronn (DE); Michael Patra, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 526 days.

(21) Appl. No.: 14/567,645

(22) Filed: Dec. 11, 2014

(65) Prior Publication Data

US 2015/0092174 A1    Apr. 2, 2015

Related U.S. Application Data

(63) Continuation of application No. PCT/EP2013/065004, filed on Jul. 16, 2013.
(Continued)

(30) Foreign Application Priority Data

Jul. 17, 2012  (DE) .................. 10 2012 212 453

(51) Int. Cl.
*G03B 27/72* (2006.01)
*G03F 7/20* (2006.01)
(Continued)

(52) U.S. Cl.
CPC ...... *G03F 7/70116* (2013.01); *G02B 26/0833* (2013.01); *G03F 7/702* (2013.01); *G03F 7/70075* (2013.01); *G03F 7/70083* (2013.01); *G03F 7/70233* (2013.01); *G21K 1/06* (2013.01); *G21K 2201/067* (2013.01)

(58) Field of Classification Search
CPC ................. G02B 26/0833; G21K 1/06; G21K 2201/067; G03F 7/70075; G03F 7/70116; G03F 7/702; G03F 7/70233; G03F 7/70833; G03F 7/70091; G03F 7/70125; G03F 7/70208
USPC ..................... 355/46, 52, 53, 55, 67–71, 77; 250/492.1, 492.2, 492.22, 492.23, 493.1, 250/503.1, 548; 359/627, 850, 851, 853, 359/856, 857, 865
See application file for complete search history.

(56) References Cited

U.S. PATENT DOCUMENTS 6,658,084 B2   12/2003  Singer
6,859,515 B2   2/2005  Schultz et al.
(Continued)

FOREIGN PATENT DOCUMENTS

DE   10 2008 009 600 A1   8/2009
DE   10 2009 000 099 A1   7/2010
(Continued)

OTHER PUBLICATIONS

German Office Action, with translation thererof, for DE Appl No. 10 2012 212 453.5, dated Feb. 1, 2013.
(Continued)

*Primary Examiner* — Christina Riddle
(74) *Attorney, Agent, or Firm* — Fish & Richardson P.C.

(57) ABSTRACT

An illumination optical unit comprises a first faceted element and a second faceted element having a multiplicity of displaceable micromirrors which can be grouped flexibly to form facets.

23 Claims, 12 Drawing Sheets

Related U.S. Application Data

Figure 1:
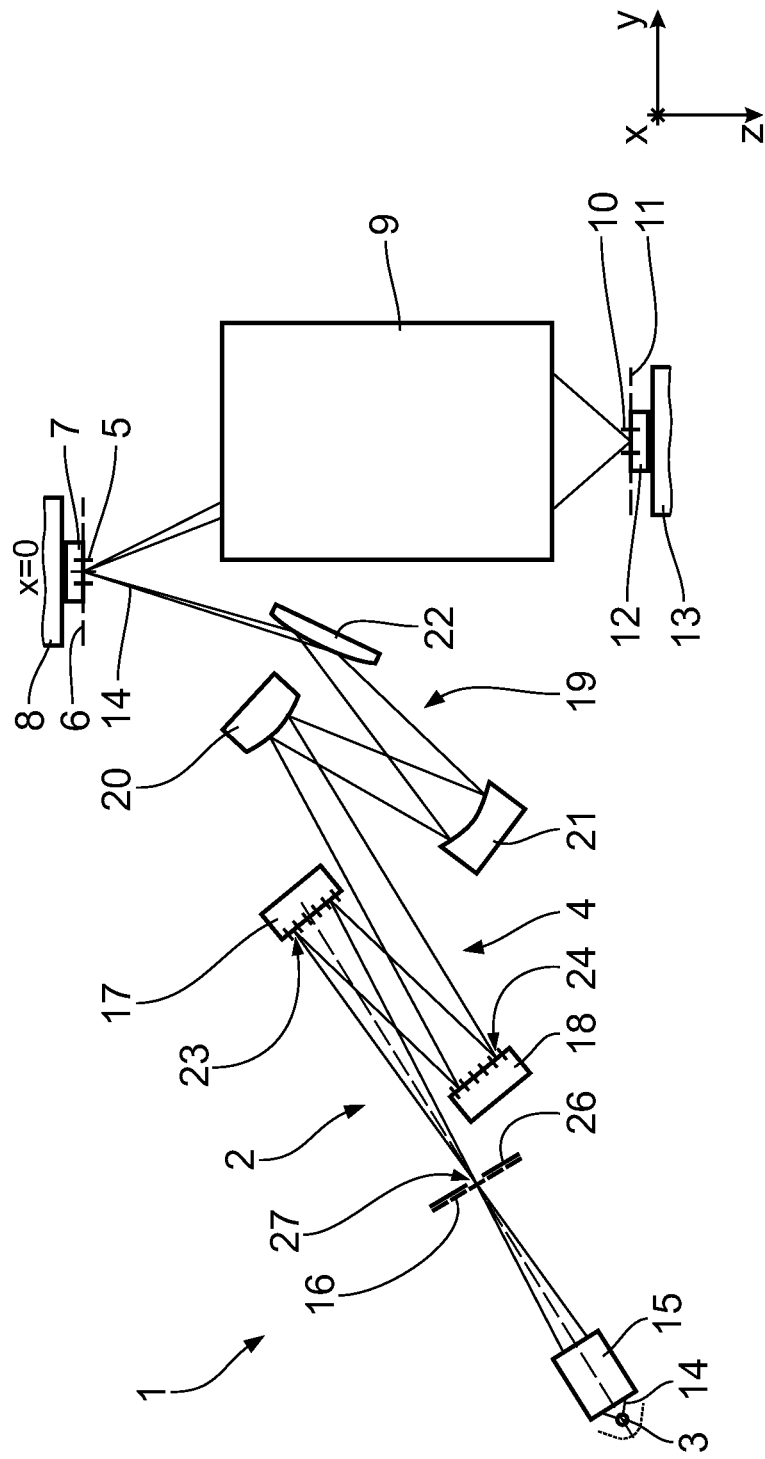

(60) Provisional application No. 61/672,435, filed on Jul. 17, 2012.

(51) Int. Cl.
*G02B 26/08* (2006.01)
*G21K 1/06* (2006.01)

(56) References Cited

U.S. PATENT DOCUMENTS

| | | | |
|---|---|---|---|
| 9,411,241 B2 | 8/2016 | Dinger et al. | |
| 2008/0165925 A1* | 7/2008 | Singer | G03F 7/70075 378/34 |
| 2009/0251677 A1* | 10/2009 | Endres | G02B 27/0905 355/71 |
| 2011/0001947 A1 | 1/2011 | Dinger et al. | |
| 2011/0122392 A1* | 5/2011 | Fiolka | G03F 7/70075 355/71 |
| 2011/0273694 A1 | 11/2011 | Werber et al. | |
| 2014/0036247 A1 | 2/2014 | Endres | |

FOREIGN PATENT DOCUMENTS

| | | |
|---|---|---|
| DE | 10 2011 076 297 A1 | 11/2012 |
| JP | 2008-544531 | 12/2008 |
| JP | 2011-503831 | 1/2011 |
| JP | 2011-512659 A | 4/2011 |
| WO | WO 2004/092844 A2 | 10/2004 |
| WO | WO 2006/136353 | 12/2006 |
| WO | WO 2009/100856 A1 | 8/2009 |
| WO | WO 2011/060975 | 5/2011 |
| WO | WO 2011/154244 A1 | 12/2011 |

OTHER PUBLICATIONS

International Search Report for corresponding PCT Appl No. PCT/EP2013/065004, dated Nov. 11, 2013.

Japanese Office Action, with translation thereof, for corresponding JP Appl No. 2015-522017, dated Apr. 18, 2017.

* cited by examiner

ILLUMINATION OPTICAL UNIT

CROSS-REFERENCE TO RELATED APPLICATIONS

The present application is a continuation of, and claims benefit under 35 USC 120 to, international application PCT/EP2013/065004, filed Jul. 16, 2013, which claims benefit under 35 USC 119 of German Application No. 10 2012 212 453.5, filed Jul. 17, 2012. International application PCT/EP2013/065004 also claims priority under 35 USC 119(e) to U.S. Provisional Application No. 61/672,435, filed Jul. 17, 2012. The entire disclosure of international application PCT/EP2013/065004 and German Application No. 10 2012 212 453.5 are incorporated by reference herein.

The invention relates to an illumination optical unit for a projection exposure apparatus. The invention furthermore relates to an illumination system comprising such an illumination optical unit and to a method for designing such an illumination system. Moreover, the invention relates to a projection exposure apparatus, a method for producing a micro- or nanostructured component, and a component produced in this way.

An illumination optical unit for a projection exposure apparatus is known for example from WO 2009/100856 A1 or DE 10 2008 009 600.8 and DE 10 2009 000 099.2.

There is a constant need to develop such illumination optical units further.

One object of the invention is to improve an illumination optical unit for a projection exposure apparatus.

This object is achieved via an illumination optical unit for a projection exposure apparatus for transferring illumination radiation having a predefined intensity distribution in an intermediate focal plane from the intermediate focal plane into an object field. The illumination optical unit includes a first faceted element and a second faceted element. The second faceted element is arranged downstream of the first faceted element in the beam path of the illumination optical unit. The second faceted element includes a multiplicity of displaceable micromirrors which can be grouped to form facets. The grouping of the micromirrors to form facets is flexibly variable. The micromirrors are grouped to form facets in such a way that an intensity distribution on at least one facet has a minimum ($I_{min}$) and a maximum ($I_{max}$), wherein the following holds true: $I_{min} \geq 0.05\ I_{max}$.

The heart of the invention consists in forming the second facet mirror in the beam path of an illumination optical unit with a multiplicity of displaceable micromirrors which can be grouped to form facets, wherein the grouping of the micromirrors to form facets is flexibly variable, and wherein at least one facet is designed in such a way that a portion of the illumination radiation is discarded. In this case, the facet is designed, in particular, in such a way that the phase space region of the illumination radiation having the lowest intensity is discarded. The micromirrors are grouped to form facets, in particular, in such a way that an intensity distribution on at least one facet has a minimum $I_{min}$ and a maximum $I_{max}$, wherein the following holds true: $I_{min} \geq 0.05\ I_{max}$, in particular $I_{min} \geq 0.10\ I_{max}$, in particular $I_{min} \geq 0.15\ I_{max}$.

The micromirrors are grouped to form facets, in particular, in such a way that at least 5%, in particular at least 10%, in particular at least 15%, of the illumination radiation is discarded, that is to say does not contribute to the illumination of the object field. In this case, the intensity on the facets can also fall to 0 in regions. It is possible, for example, to trim one or a plurality or else all of the facets in specific regions, in particular specific edge regions, for example on one side. Preferably, the micromirrors are grouped to form facets in such a way that the illumination radiation having the lowest intensity is discarded, and the intensity distribution on the facets in each case has a minimum value $I_{min}$ in accordance with the above description.

The micromirrors are grouped to form facets, in particular, in such a way that the étendue in the beam path downstream of the second facet mirror is lower, in particular lower by at least 5%, in particular at least 10%, in particular at least 15%, than the étendue in the beam path upstream of the second facet mirror. In this case, the étendue in the beam path upstream of the second facet mirror can be provided, in particular, by the size and numerical aperture of the entrance pupil, in particular in the region of an intermediate focus.

The numerical aperture of the entrance pupil, in particular in the region of the intermediate focus, can be at least 0.1, in particular at least 0.2, in particular at least 0.5. The entrance pupil, in particular the free aperture in the region of the intermediate focus, has in particular a diameter of at least 1 mm, in particular at least 3 mm, in particular at least 10 mm.

From an illustrative point of view, this can be achieved by the corresponding facet being trimmed, in particular trimmed marginally. This should be understood to mean that the size of the facet is reduced. This leads to a smaller pupil filling and thus to an improved contrast.

Preferably, at least 10%, in particular at least 30%, in particular at least 50%, in particular at least 70%, in particular at least 90%, in particular all, of the facets of the second facet mirror are designed accordingly.

The grouping of the micromirrors to form facets can be chosen flexibly in particular during the operation of the illumination optical unit. This makes it possible, during operation, to adapt, in particular to optimize, the properties of the second facet mirror and thus of the illumination pupil to predefined requirements. In other words, in the case of the illumination optical unit according to the invention, the formation of the facets of the second facet mirror is not easily predefined, but rather can be varied, in particular optimized, as required. It can be adapted, in particular, to the properties of a radiation source which are not known a priori. This firstly improves the flexibility of the illumination optical unit and secondly improves the optical properties of the illumination optical unit and thus of the illumination of an object field. The second facet mirror can be a pupil facet mirror, in particular. However, the second facet mirror need not necessarily be arranged in a pupil plane of the illumination optical unit. For the sake of simplicity, the second facet mirror is nevertheless designated hereinafter as pupil facet mirror, and its facets as pupil facets. Correspondingly, for the sake of simplicity, the first facet mirror is designated hereinafter as field facet mirror, and its facets as field facets.

The pupil facet mirror can be formed in particular as a microelectromechanical system (MEMS). For details reference should be made to WO 2009/100856 A1 or DE 10 2008 009 600.8 and DE 10 2009 000 099.2, the content of which is hereby incorporated fully in the present application.

Preferably, the field facets of the field facet mirror are also displaceable. In one particularly advantageous embodiment, the field facet mirror also comprises a multiplicity of displaceable micromirrors which can be grouped to form field facets. Preferably, the field facet mirror is also formed as an MEMS. This further increases the flexibility of the illumination optical unit.

The pupil facets can be assigned to the field facets of the field facet mirror for forming illumination channels. In this case, an illumination channel is formed respectively by a pair comprising a field facet and the assigned pupil facet. For details reference should again be made to WO 2009/100856 A1 or DE 10 2008 009 600.8 and DE 10 2009 000 099.2.

In accordance with one aspect of the invention, the micromirrors of the pupil facet mirror can be grouped to form pupil facets of different illumination pupils. The choice of possible illumination pupils encompasses, in particular, circular, annular, dipole-like, quadrupole-like and so-called quasar-like illumination pupils. Alternative illumination pupils are likewise possible. The different illumination pupils have, in particular, different étendues and/or a different pupil filling and/or lead to a different transmission of the illumination system. In this case, transmission should be understood to mean the ratio of the intensity reflected to the object field to the intensity of the illumination radiation that is incident overall in the illumination optical unit.

In accordance with one aspect of the invention, the micromirrors can be grouped to form pupil facets having different geometrical designs. In this case, the geometrical design of a pupil facet should be understood to mean, in particular, its size and/or form and/or arrangement on the pupil facet mirror. In other words, the size of one or a plurality, in particular all, of the pupil facets can be flexibly set via a targeted grouping of the micromirrors. The same applies to the form of the pupil facets and/or the arrangement thereof.

In accordance with one aspect of the invention, the micromirrors can be grouped in such a way that different pupil facets of a grouping have different geometrical designs. The pupil facets can have, in particular, different sizes and/or different forms. As an alternative thereto, it is also possible to group the micromirrors in such a way that all of the pupil facets of a grouping have an identical size and form.

In accordance with one aspect of the invention, the field facets of the field facet mirror are displaceable. They have preferably at least two, in particular at least three, discrete positions. They can also be adjustable in a continuously variable manner. Preferably, at least one of the possible positions of the field facets is such that the illumination radiation impinging on the respective field facet in this position is not directed to the second facet mirror. Consequently, the illumination radiation impinging on this field facet in particular does not contribute to the illumination of the object field. Such a displaceability of the field facets is also designated as switchability thereof. Alternatively, in one of the possible positions of the field facet, although the illumination light can reach the second facet mirror, it is then deflected there in such a way that the illumination light does not contribute to the illumination of the object field.

Preferably, the field facet mirror is also formed as an MEMS. This further improves the flexibility of the illumination optical unit.

A further object of the invention is to improve an illumination system for a projection exposure apparatus.

This object is achieved via an illumination system that includes an illumination optical unit as described above and a radiation source. The advantages correspond to those described above.

In accordance with one aspect of the invention, the geometrical design of the pupil facets is chosen in a manner dependent on properties of the radiation source. It is possible, in particular, to predefine a specific illumination pupil, in particular an illumination pupil having a predetermined form and/or a predefined étendue, and to group the micromirrors to form pupil facets in such a way that the pupil facets have a size and/or form and/or arrangement adapted to the properties of the radiation source, in particular the étendue, intensity profile or homogeneity thereof.

This enables the user in particular to optimize the transmission and/or pupil filling depending on the application and as required. In particular, the radiation generated by the radiation source is used better with the illumination system according to the invention.

The illumination system according to the invention makes it possible, in particular, to increase the efficiency.

In accordance with a further aspect of the invention, the illumination system comprises a stop, the size and/or form of which can be adapted to the size and/or form of the pupil facets. The stop is arranged, in particular, in the region of an intermediate focal plane, i.e. at the location of a secondary light source. It can be arranged in a conjugate plane with respect to the pupil plane, or at least near the pupil. It is preferably arranged at least near the pupil. When the size of an illumination in the intermediate focus is considered hereinafter, this is always taken to mean the size of the illumination in the beam path upstream of the stop.

A variable stop, in particular an intermediate focus stop configured in variable fashion, makes it possible for illumination radiation which is not transferred into the object field by the illumination optical unit to be masked out already at the input of the illumination optical unit. This reduces the thermal load of the illumination optical unit.

In accordance with a further aspect of the invention, at least one of the facets of the second facet mirror has a size which is smaller than the size of an image of the radiation source on the second facet mirror. Preferably, at least 10%, in particular at least 30%, in particular at least 50%, in particular at least 70%, in particular at least 90%, in particular all, of the facets are designed in this way. The size of the facets preferably corresponds to at most 90%, in particular at most 75%, in particular at most 50%, in particular at most 40%, of the size of the image of the radiation source on the second facet mirror.

The facets are thus designed in such a way that part of the illumination radiation is discarded. They are designed, in particular, in such a way that the part of the illumination radiation having the lowest intensity is discarded. As a result, the pupil filling can be reduced, at the same time the total transmission being kept as high as possible.

The size of the facets can be chosen, in particular, in such a way that the intensity distribution on at least one of the facets has a minimum $I_{min}$ and a maximum $I_{max}$, wherein the following holds true: $I_{min} \geq 0.05 \, I_{max}$, in particular $I_{min} \geq 0.10 \, I_{max}$, in particular $I_{min} \geq 0.15 \, I_{max}$. For further advantageous designs of the facets, reference should be made to the above description of the illumination optical unit.

In accordance with a further aspect of the invention, a totality of regions of the first facet mirror that are used for guiding illumination radiation into an object field has a size which is smaller than the size of a region that can be illuminated by the radiation source on the first facet mirror.

This has the effect that the angular distribution of the radiation in the intermediate focal plane which contributes to the illumination of the object field is limited. In other words, the phase space is limited, in particular trimmed, with respect to the angular coordinates. Preferably, that part of the phase space which has the lowest intensity is discarded, that is to say the part which makes the smallest contribution to the total transmission. It is possible, in particular, to use only that region of the first facet mirror for transferring illumination radiation into the object field in which the illumination radiation has a minimum intensity of at least 5%, in particular at least 10%, in particular at least 15%, of the maximum intensity of the illumination radiation. The optical quality of the illumination system can be improved by this means as well.

In accordance with a further aspect of the invention, a stop is arranged in the region of the intermediate focal plane, with a radiation-transmissive region which is smaller than the size of an image of the radiation source in the region of the intermediate focal plane. This makes it possible for part of the illumination radiation to be discarded already in the region of the intermediate focal plane. This leads to a reduction of the thermal load in the illumination optical unit. The stop preferably has a radiation-transmissive region which amounts to at most 90%, in particular at most 75%, in particular at most 50%, in particular at most 40%, of the size of the image of the radiation source in the region of the intermediate focal plane. In this case, and also in the text above, the size of the image should be understood to mean, in particular, the area or the largest diameter of the image of the radiation source.

In accordance with a further aspect of the invention, the stop is designed in a variable fashion. It has, in particular, a radiation-transmissive region of a variable size. The radiation-transmissive region can be set, in particular, to the values indicated above.

The stop is designed, in particular, in such a way that the radiation intensity in the radiation-transmissive region of the stop has a minimum $I_{min}$ and a maximum $I_{max}$, wherein the following holds true: $I_{min} \geq 0.05\ I_{max}$, in particular $I_{min} \geq 0.10\ I_{max}$, in particular $I_{min}, \geq 0.15\ I_{max}$.

In accordance with a further aspect of the invention, different facets make comparable contributions to the illumination of the object field. The contribution of two arbitrary facets to the illumination of the object field deviates from one another in particular by a maximum of 10%.

The optical quality of the illumination system is further improved by this approach.

A further object of the invention is to improve a method for designing an illumination system.

This object is achieved via a method for designing an illumination system that includes the following steps: a. providing an illumination system as described above; b. predefining a specific illumination pupil having a specific étendue; c. predefining at least one parameter to be adapted of the illumination pupil; d. grouping at least some of the micromirrors of the second faceted element to form facets; e. wherein in each case one of the facets is assigned to a facet of the first faceted element in such a way that illumination radiation from the radiation source can be applied to it via the respective facet, f. wherein the micromirrors are grouped to form facets in such a way that the parameter to be adapted lies in a predetermined range, g. wherein the illumination parameter to be adapted is the transmission and/or pupil filling, and h. wherein for adapting the illumination parameter the number and/or size and/or arrangement of the facets and/or of the facets are/is chosen.

The heart of the invention consists in predefining a specific illumination pupil having a specific étendue and at least one parameter to be adapted of the illumination pupil, and grouping the micromirrors of the pupil facet mirror to form pupil facets in such a way that the parameter to be adapted lies in a predetermined range.

The illumination parameter to be adapted can be, in particular, the transmission of the illumination system and/or the pupil filling. The transmission has a crucial influence on the intensity of the illumination radiation which is transferred into the object field by the illumination optical unit.

The pupil filling has a crucial influence on the contrast of the illumination. By way of example, if an illumination pupil is predefined which has a lower étendue than the radiation source, radiation from the radiation source must be discarded, that is to say that it cannot be used for illuminating the object field. A flexible grouping of the micromirrors to form pupil facets makes it possible to optimize the illumination of the object field with regard to the illumination intensity and/or the contrast. This can be determined flexibly in particular during the operation of the illumination system.

In accordance with one aspect of the invention, for adapting the illumination parameter the number and/or size and/or arrangement of the pupil facets are/is chosen suitably.

The method is also designated as a method for setting or as a method for adapting the illumination system.

Further objects of the invention are to specify a projection exposure apparatus for microlithography comprising the illumination system according to the invention, a method for producing a component using the projection exposure apparatus, and a component produced by the method.

These objects are achieved according to the invention via: a) a projection exposure apparatus for microlithography including an illumination system described above and a projection optical unit for projecting the object field into an image field; b) a method that includes providing such a projection exposure apparatus, providing a reticle, providing a wafer having a light-sensitive coating, projecting at least one section of the reticle onto the wafer with the aid of the projection exposure apparatus, developing the exposed light-sensitive coating on the wafer; and via a component produced by such a method.

The projection exposure apparatus is preferably embodied as a scanner. The projection exposure apparatus has, in particular, both for the object to be imaged and for a substrate onto which imaging is effected, e.g. a wafer, a holder which is displaceable in the scanning direction during projection exposure.

The advantages are evident from those described above.

Figure 2:
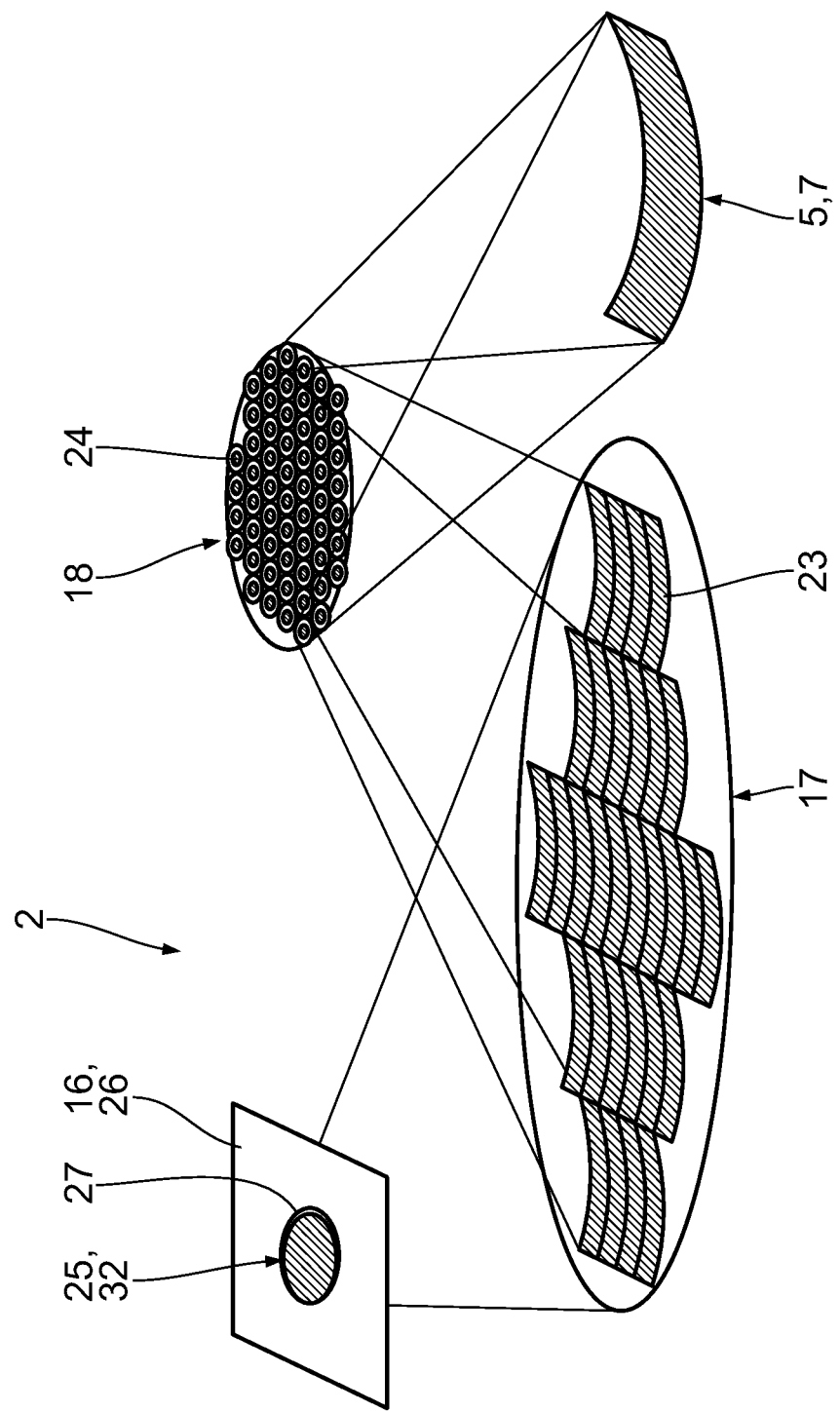
Figure 3:
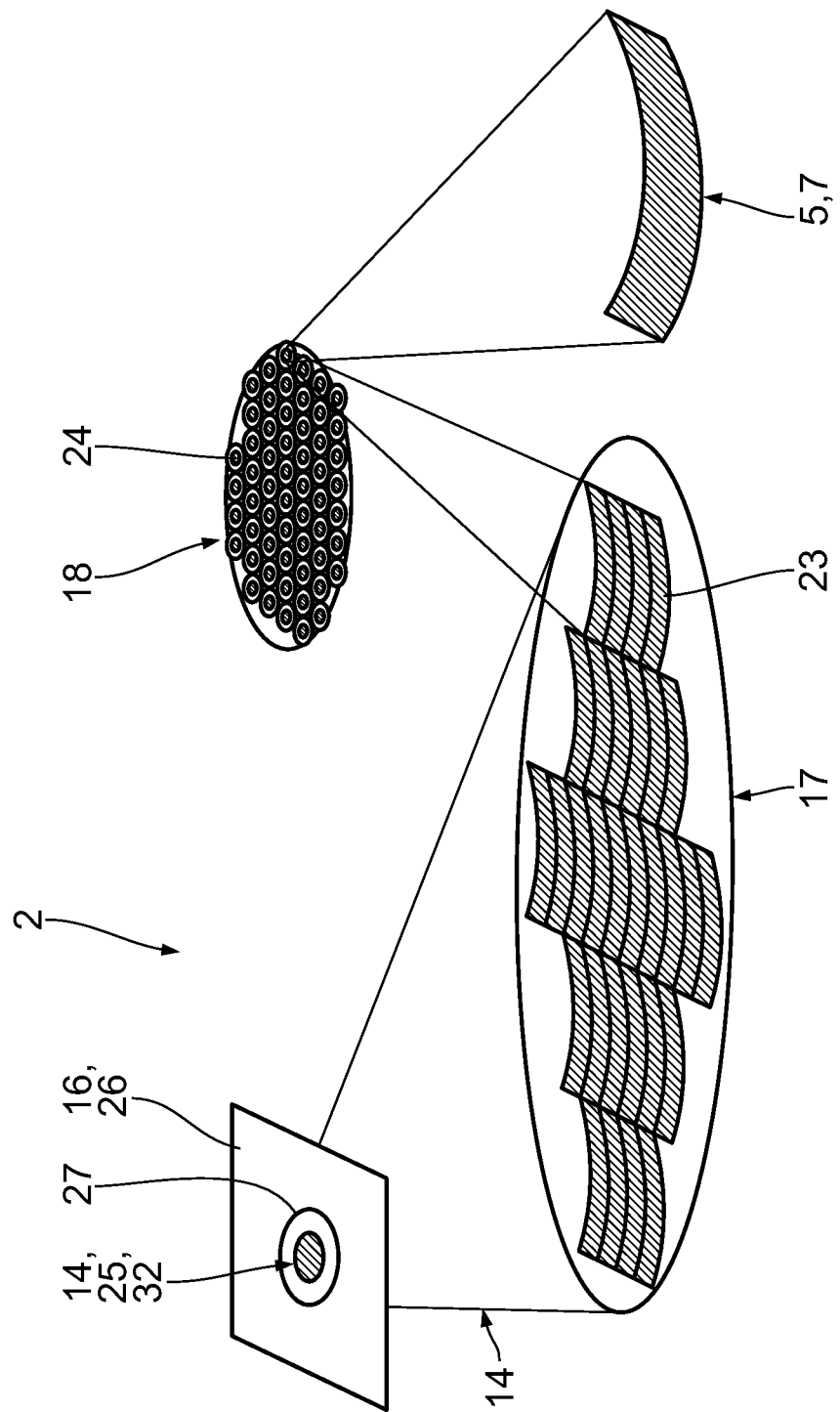
Figure 4:
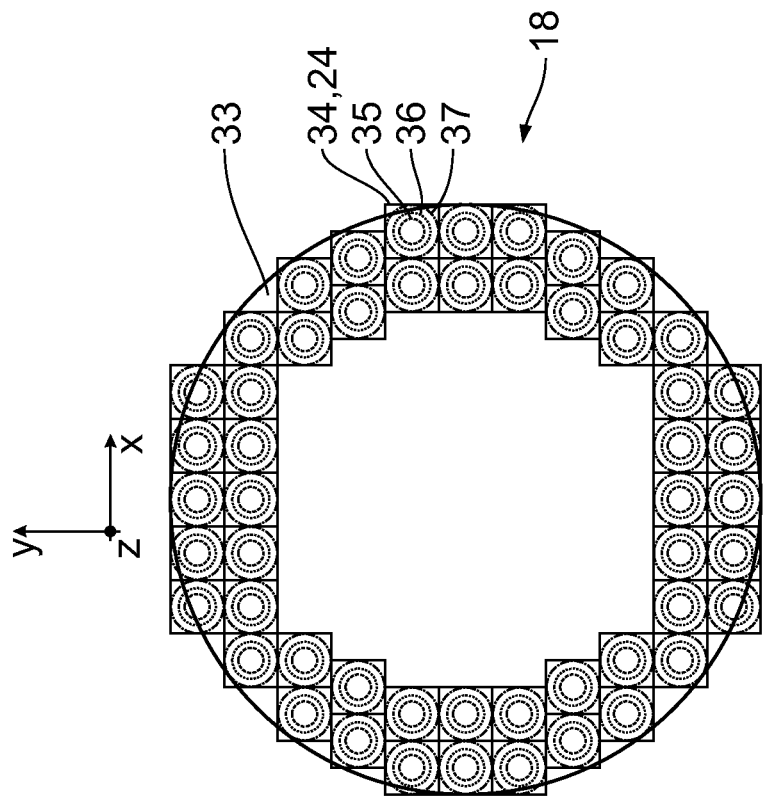
Figure 5:
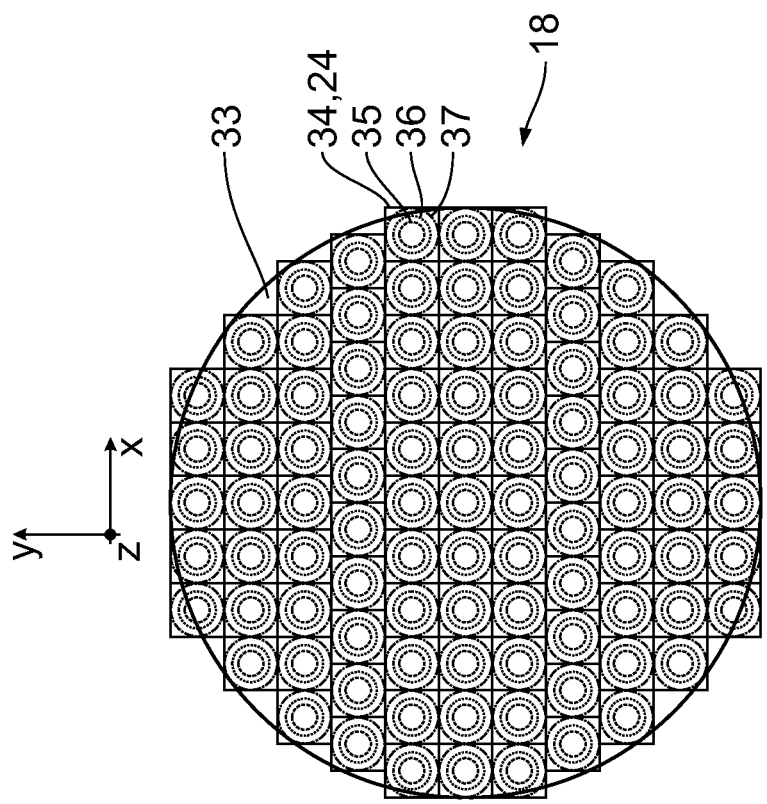
Figure 7:
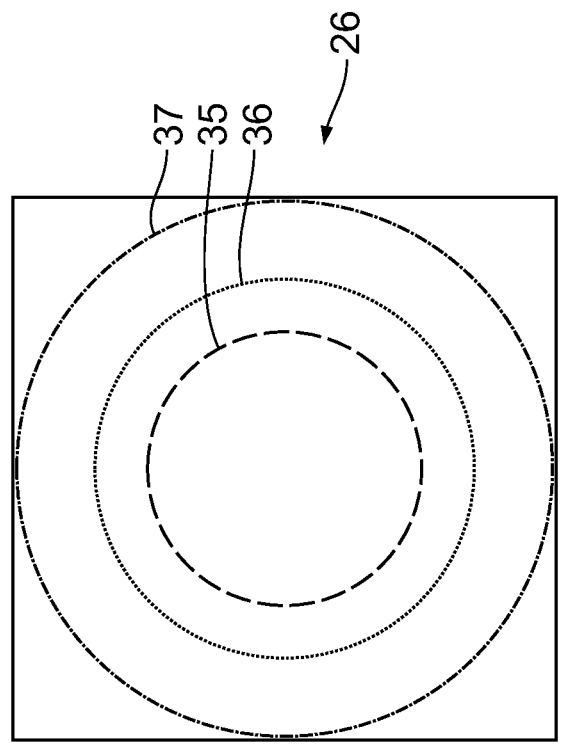
Figure 6:
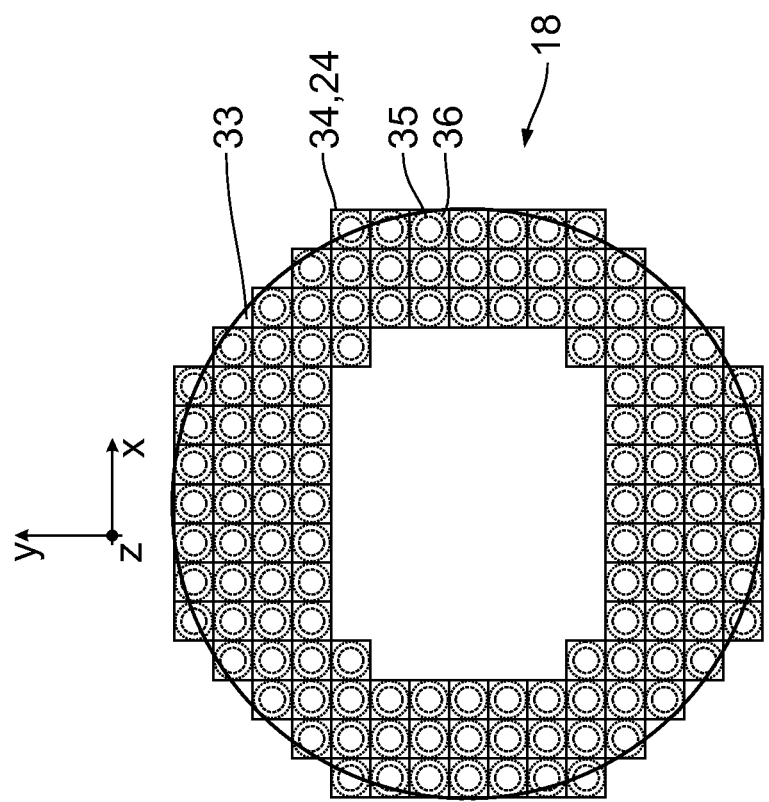
Figure 8:
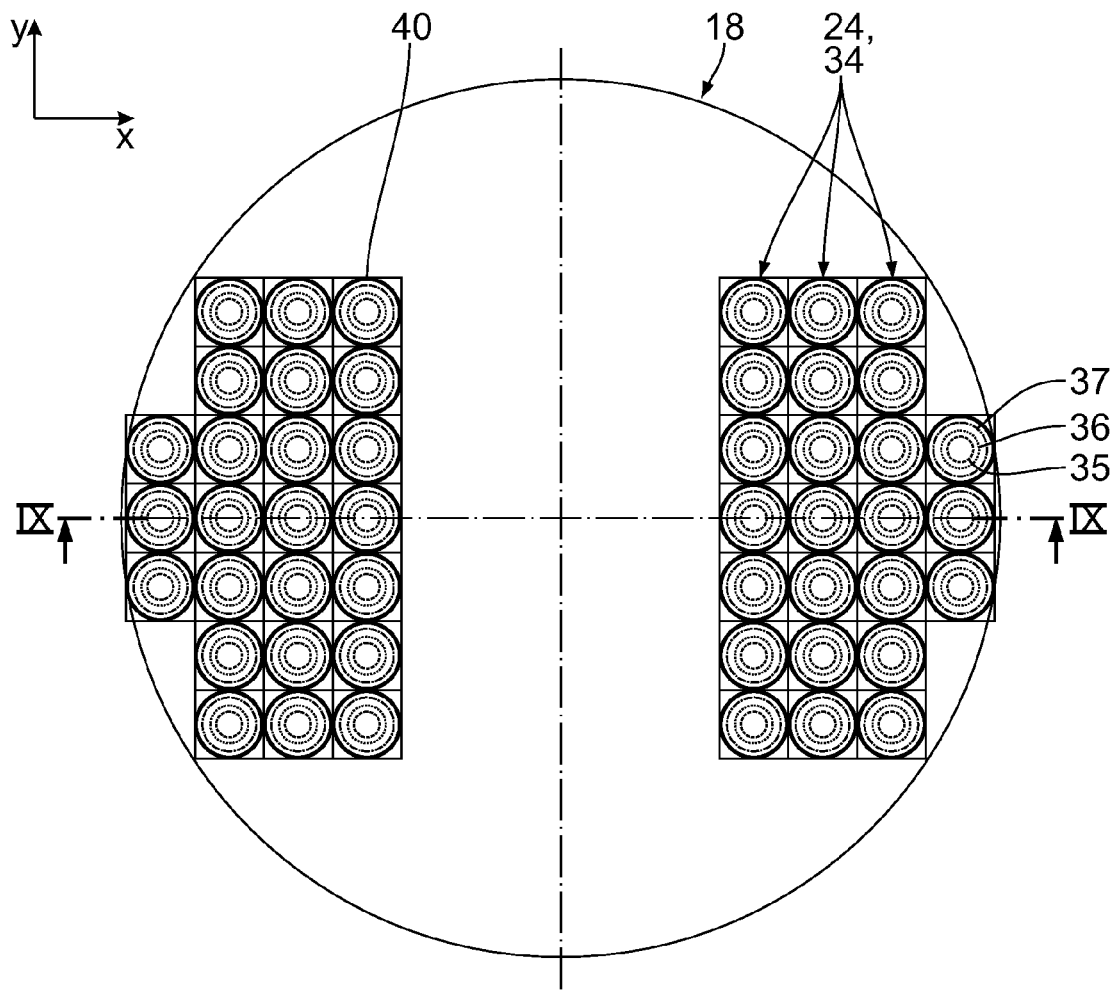
Figure 9:
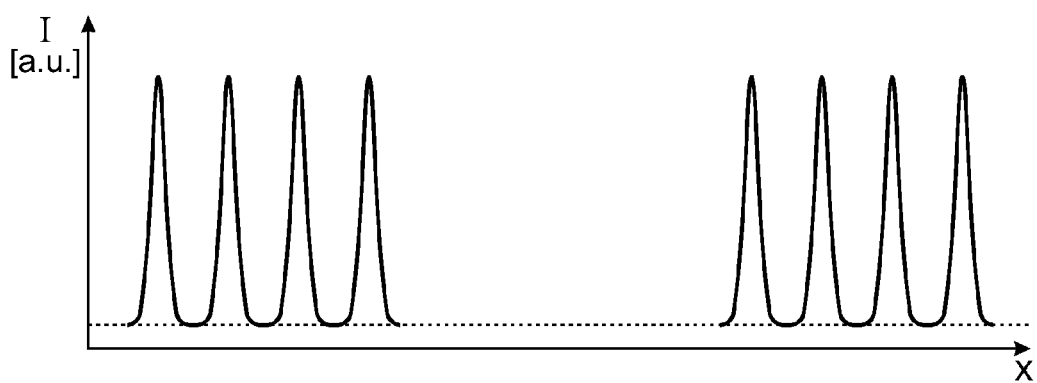
Figure 10:
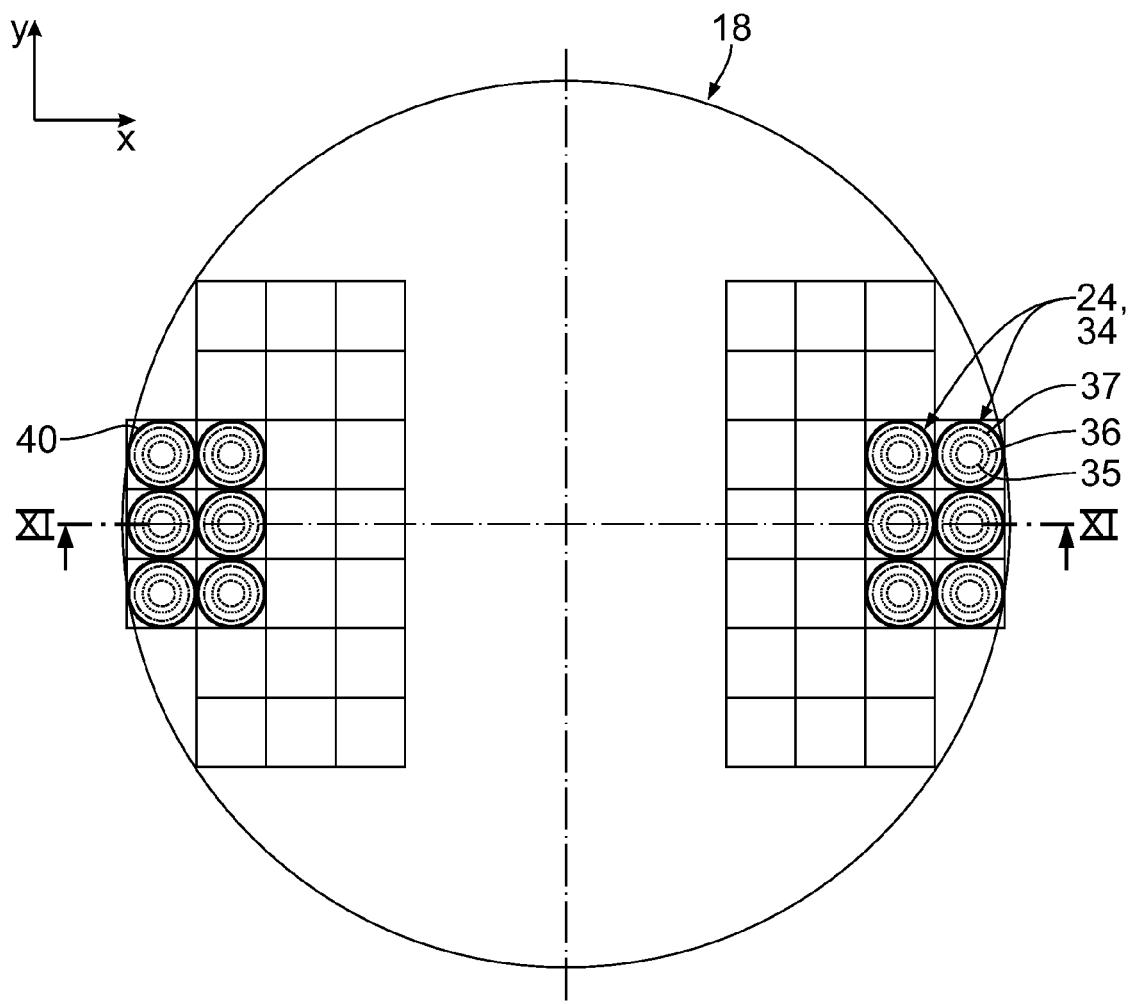
Figure 11:
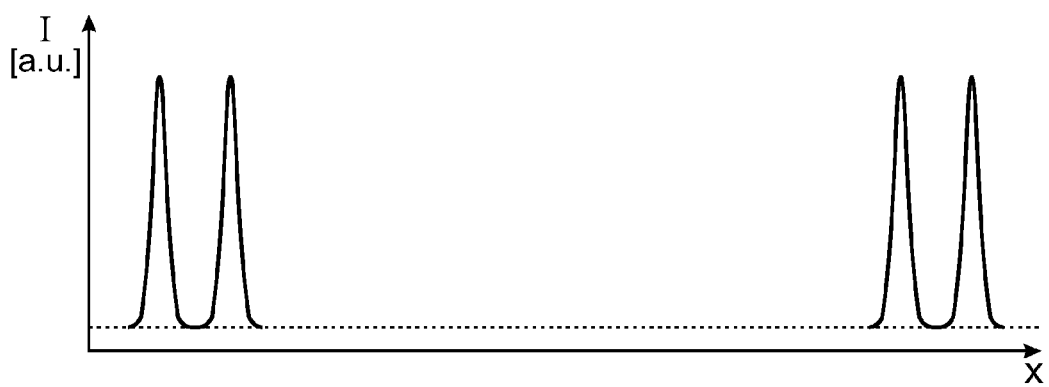
Figure 12:
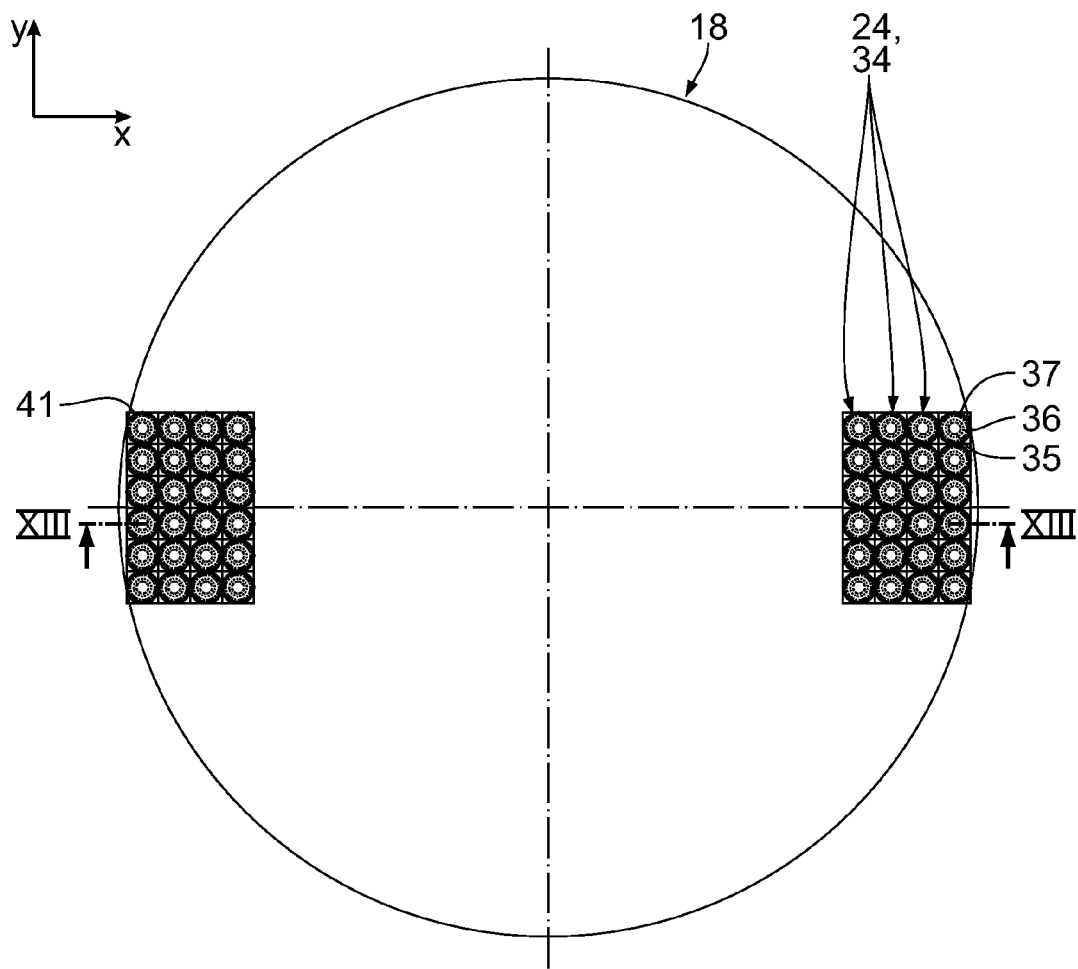
Figure 13:
Figure 14:
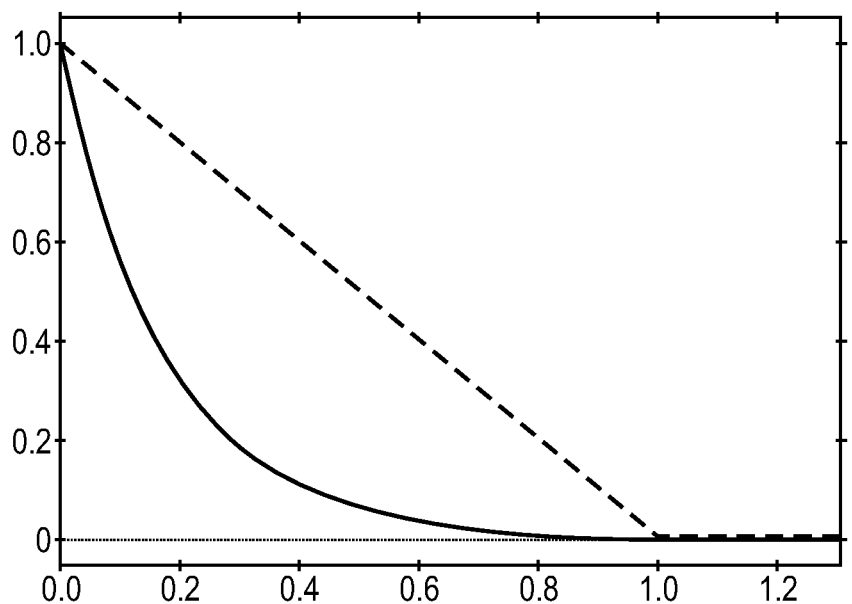
Figure 15:
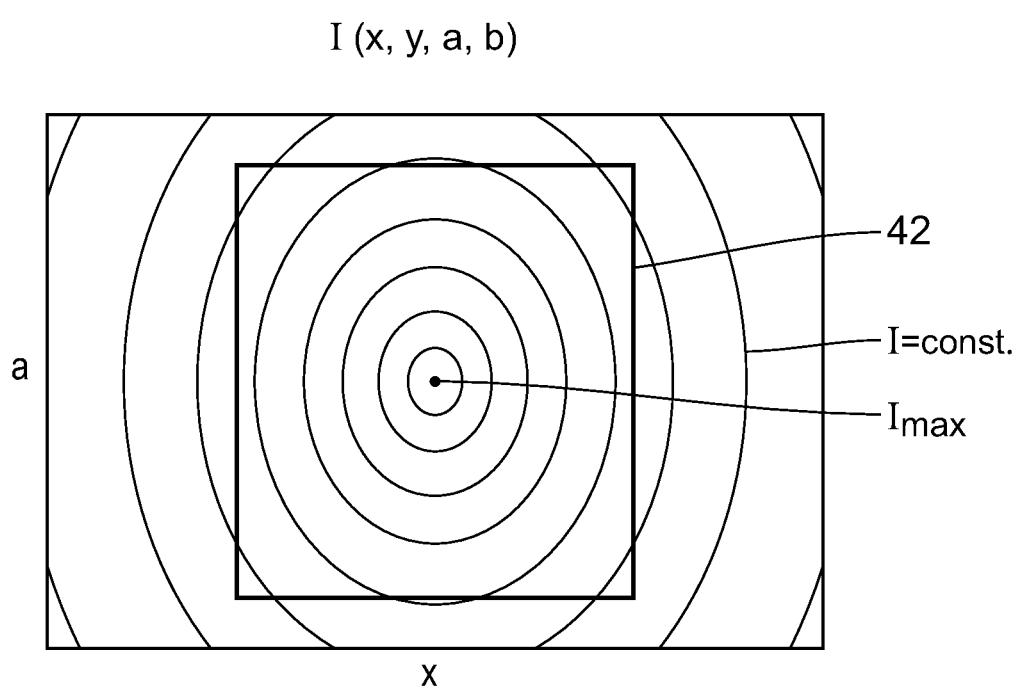
Figure 16:
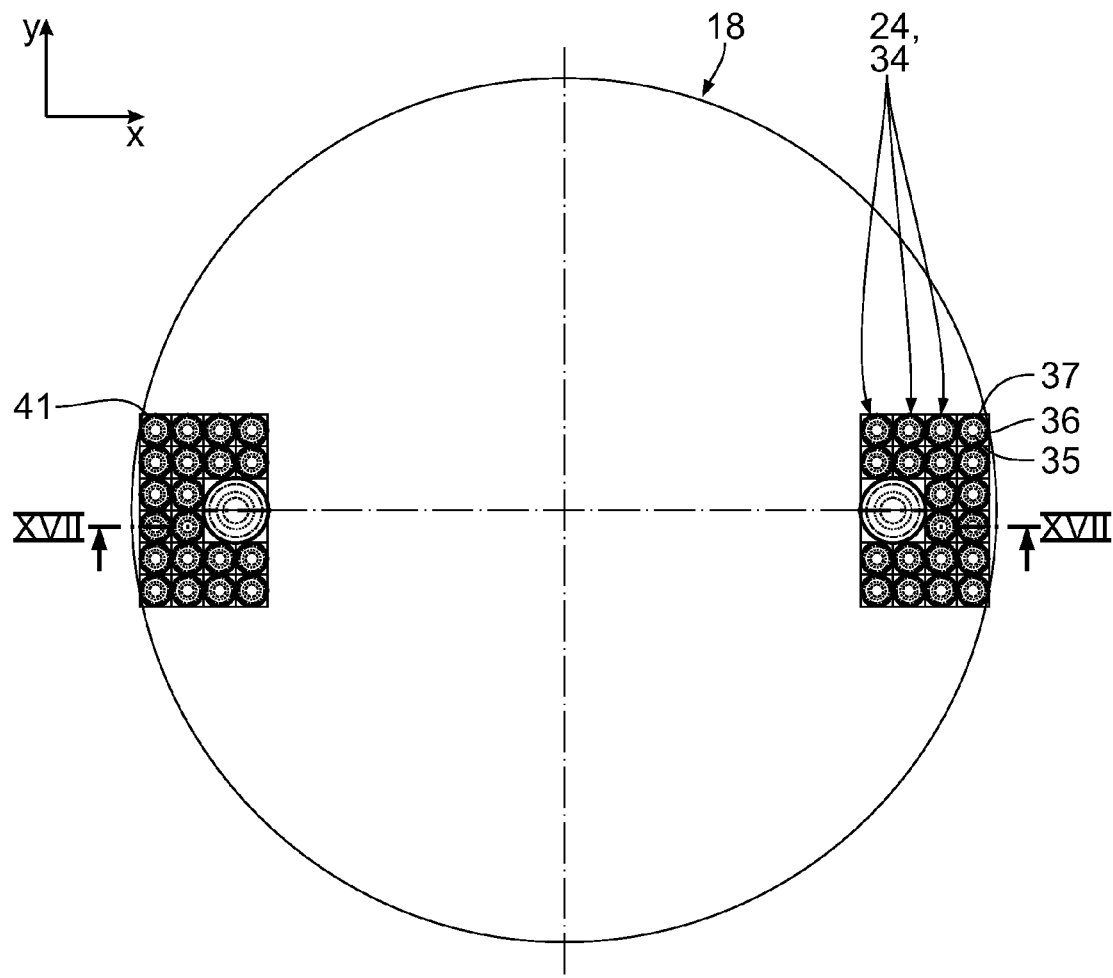
Figure 17:
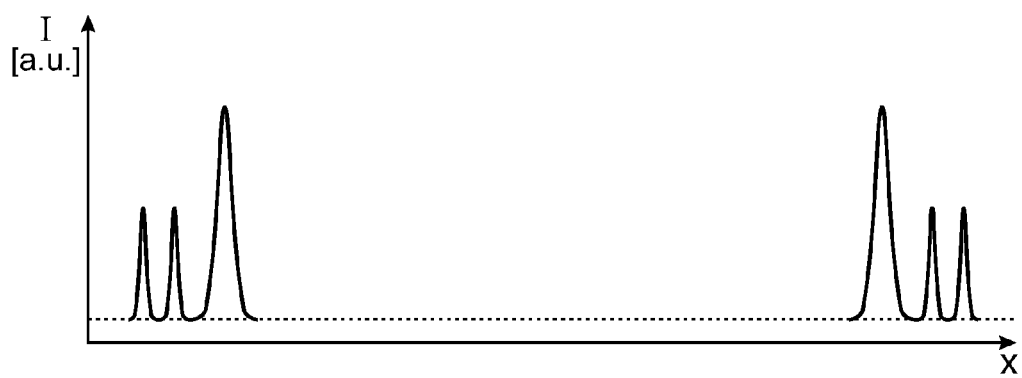
Figure 18:
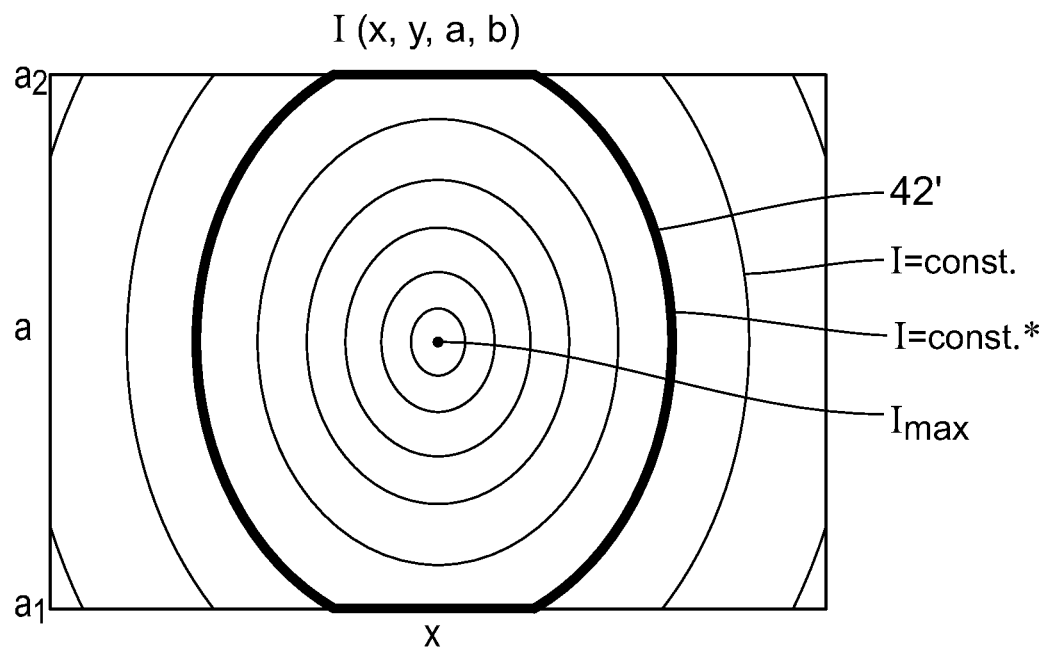
Figure 19:
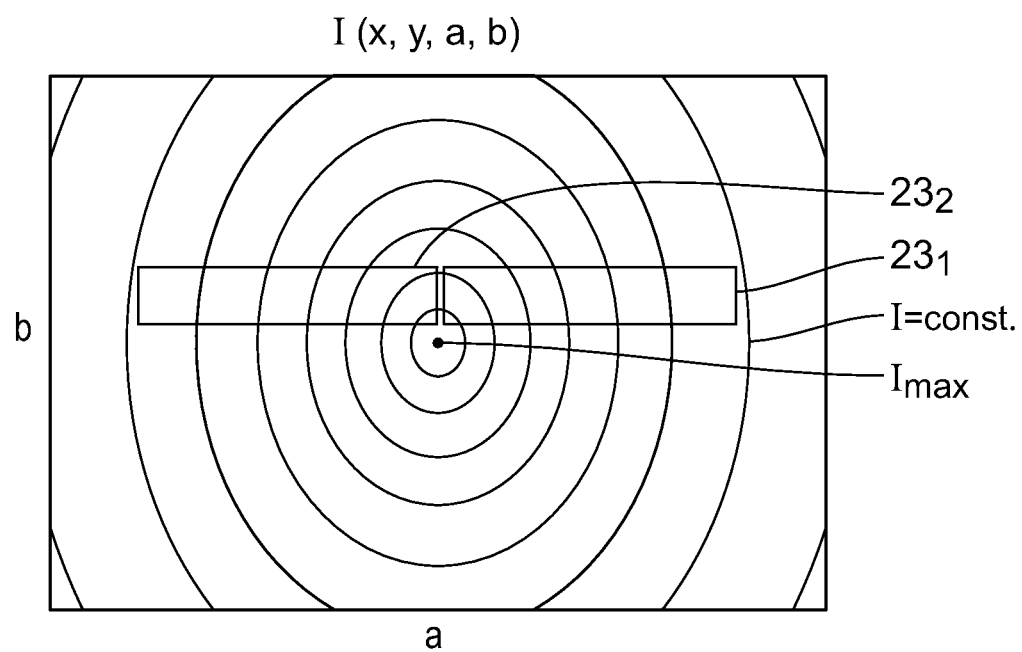
Figure 20:
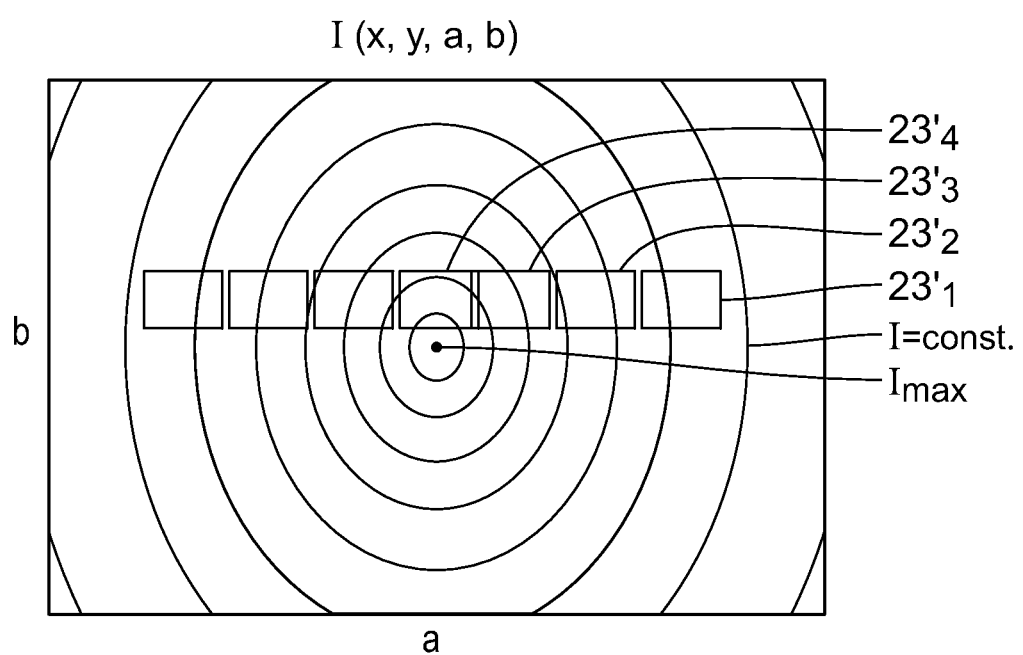

Further advantages, details and particulars of the invention will become apparent from the description of the exemplary embodiments with reference to the drawings, in which:

FIG. 1 schematically shows a meridional section through a projection exposure apparatus for EUV projection lithography, FIG. 2 shows a schematic illustration of the étendue assumptions in the design of an illumination system, FIG. 3 shows a schematic illustration of the illumination situation of the illumination system in accordance with FIG. 2 with the use of a radiation source having a lower étendue, FIG. 4 shows a schematic illustration of a pupil facet mirror having a multiplicity of micromirrors grouped to form a first arrangement of pupil facets, FIG. 5 shows an illustration in accordance with FIG. 4 with an alternative grouping of the micromirrors to form an annular illumination pupil, FIG. 6 shows an illustration in accordance with FIG. 5 with an alternative grouping of the micromirrors to produce an annular illumination pupil, FIG. 7 shows a schematic illustration of a variable intermediate focus stop, FIG. 8 shows an illustration in accordance with FIG. 4 with an alternative grouping of the micromirrors for forming a dipole illumination setting, FIG. 9 shows an illustration of the intensity profile along the line IX-IX on the pupil facet mirror in accordance with FIG. 8, FIG. 10 shows an illustration in accordance with FIG. 8 with a lower degree of pupil filling, FIG. 11 shows an illustration of the intensity profile along the line XI-XI on the pupil facet mirror in accordance with FIG. 10, FIG. 12 shows an illustration in accordance with FIG. 10 with smaller pupil facets, FIG. 13 shows an illustration of the intensity profile along the line XIII-XIII on the pupil facet mirror in accordance with FIG. 12, FIG. 14 schematically shows the advantageous effects of the design according to the invention of the pupil facets on the total transmission of the illumination optical unit, FIG. 15 schematically shows isolines of the intensity distribution in a two-dimensional excerpt from the four-dimensional phase space in the region of an intermediate focus, FIG. 16 shows an illustration in accordance with FIG. 12 with pupil facets of different sizes, FIG. 17 shows an illustration of the intensity profile along the line XVII-XVII on the pupil facet mirror in accordance with FIG. 16, FIG. 18 schematically shows an optimum region of the intensity distribution in a two-dimensional excerpt from the four-dimensational phase space in the region of an intermediate focus, FIG. 19 schematically shows an arrangement of field facets on a first faceted element of a specular reflector in a two-dimensional excerpt from the four-dimensional phase space in the region of an intermediate focus, and FIG. 20 schematically shows an arrangement of regions on a first faceted element of a specular reflector in a two-dimensional excerpt from the four-dimensional phase space in the region of an intermediate focus.

FIG. 1 schematically shows, in a meridional section, a projection exposure apparatus 1 for microlithography. An illumination system 2 of the projection exposure apparatus 1 has, alongside a radiation source 3, an illumination optical unit 4 for exposing an object field 5 in an object plane 6. In this case, a reticle 7 arranged in the object field 5 is exposed, the reticle being held by a reticle holder 8, which is merely illustrated as an excerpt.

The projection exposure apparatus 1 furthermore comprises a projection optical unit 9. The projection optical unit 9 serves for imaging the object field 5 into an image field 10 in an image plane 11. A structure on the reticle 7 is imaged onto a light-sensitive layer of a wafer 12 arranged in the region of the image field 10 in the image plane 11, the wafer being held by a wafer holder 13, which is likewise illustrated schematically.

The radiation source 3 can be, in particular, an EUV radiation source having an emitted used radiation in the range of between 5 nm and 30 nm. This can be a plasma source, for example a GDPP (Gas Discharge-Produced Plasma) source or an LPP (Laser-Produced Plasma) source. Information about such a radiation source can be found by the person skilled in the art for example in U.S. Pat. No. 6,859,515 B2. EUV radiation 14 emerging from the radiation source 3 is concentrated by a collector 15. The EUV radiation 14 is also designated hereinafter as illumination light or as imaging light. The EUV radiation 14 passes through an intermediate focal plane 16, in particular, before it impinges on a field facet mirror 17. A stop 26—also designated as intermediate focus stop—having a stop aperture 27 is arranged in the region of the intermediate focal plane 16. The field facet mirror 17 is arranged in a plane of the illumination optical unit 4 which is optically conjugate with respect to the object plane 6.

Downstream of the field facet mirror 17, the EUV radiation 14 is reflected by a pupil facet mirror 18. The pupil facet mirror 18 is arranged in a pupil plane of the illumination optical unit 4. The pupil plane of the illumination optical unit 4 is optically conjugate with respect to a pupil plane of the projection optical unit 9. With the aid of the pupil facet mirror 18 and an imaging optical assembly in the form of a transfer optical unit 19 having mirrors 20, 21 and 22 designated in the order of the beam path, field facets 23 of the field facet mirror 17 are imaged into the object field 5. The field facets 23 of the field facet mirror 17 are switchable, in particular displaceable, in particular for adaptation to different illumination pupils. For details of an illumination system 2 comprising switchable, in particular displaceable, field facets 23, reference should be made to U.S. Pat. No. 6,658,084 B2.

The field facets 23 are described in even greater detail below. The last mirror 22 of the transfer optical unit 19 is a mirror for grazing incidence ("Grazing Incidence Mirror"). The pupil facet mirror 18 and the transfer optical unit 19 form a sequential optical unit for transferring the illumination light 14 into the object field 5. The transfer optical unit 19 can be dispensed with, in particular, when the pupil facet mirror 18 is arranged in an entrance pupil of the projection optical unit 9.

For the simpler designation of positional relationships, a Cartesian xyz coordinate system is depicted in FIG. 1. In FIG. 1, the x-axis runs perpendicularly to the plane of the drawing into the latter. The y-axis runs toward the right. The z-axis runs downward. The object plane 6 and the image plane 11 both run parallel to the xy-plane.

The reticle holder 8 is displaceable in a controlled manner such that during projection exposure the reticle 7 can be displaced in a displacement direction in the object plane 6 parallel to the y-direction. Correspondingly, the wafer holder 13 is displaceable in a controlled manner such that the wafer 12 is displaceable in a displacement direction in the image plane 11 parallel to the y-direction. As a result, the reticle 7 and the wafer 12 can be scanned by the object field 5, on the one hand, and by the image field 10, on the other hand. The displacement direction is also designated as scanning direction. The displacement of the reticle 7 and of the wafer 12 in the scanning direction can preferably be effected synchronously with one another.

The collector 15 serves, in particular, for concentrating the radiation 14 from the radiation source 3 into an intermediate focus 25 in the intermediate focal plane 16. It serves, in particular, for concentrating the light distribution of the radiation source 3 in such a way that it fits through the stop aperture 27 of the intermediate focus stop 26 and, moreover, has a predefined form, in particular a predefined extent, in the region of the field facet mirror 17 having the field facets 23. It leads, in particular, to an image of the radiation source 3 in the region of the intermediate focal plane 16. The image of the radiation source 3 in the region of the intermediate focal plane 16 forms a secondary radiation source 32. The secondary radiation source 32 is imaged via the field facets 23 of the field facet mirror 17 onto pupil facets 24 of the pupil facet mirror 18, the pupil facets being described in even greater detail below.

As illustrated by way of example in FIG. 2, the illumination system 2 is designed in such a way that the size of the radiation source 3, i.e. the spatial extent of the region in which the EUV radiation 14 is generated, the size of the stop aperture 27, the size of the field facet mirror 17 and the size of the pupil facet mirror 18 and of the pupil facets 24 are adapted to one another in such a way that firstly the image of the radiation source 3 in the intermediate focal plane 16, i.e. the spatial extent of the secondary radiation source 32, corresponds precisely to the spatial extent of the stop aperture 27, the field facet mirror 17 is completely illuminated, i.e. radiation 14 is applied to all of the field facets 23, and the pupil facets 24 are completely illuminated. In this case, the number of pupil facets 24 on the pupil facet mirror 18 preferably corresponds precisely to the number of field facets 23 on the field facet mirror 17. Moreover, the pupil facets 24 are preferably arranged in a closely packed manner, i.e. as far as possible without any gaps, on the pupil facet mirror 18. The case where the pupil facets 24 are completely illuminated represents an ideal case. In practice, hitherto in the design of the illumination system 2 the question has arisen as to whether the pupil facets 24 should be completely illuminated, in order as far as possible not to lose any light, or whether the pupil facets 24 should be made as small as possible, in order to be able to pack a very large number of them on a confined space. Hitherto this decision had to be taken once at the time of designing the illumination system 2.

As is described below, the illumination system 2 can flexibly assume a design that deviates therefrom during operation. It is possible, in particular, for the illumination optical unit 4, in particular the stop 26 and/or the geometrical design of the pupil facets 24 to be designed in a flexibly variable manner. In this case, geometrical design should be understood to mean the size, form, number and arrangement of the field facets 23 and/or of the pupil facets 24. By way of example, the illumination system 2 can be flexibly adapted to the characteristic of the radiation source 3. By way of example, FIG. 3 illustrates the situation in which the illumination optical unit 4 in accordance with the exemplary embodiment in accordance with FIG. 2 is combined with a radiation source 3 having a lower étendue than that which was taken into account in the design of the illumination system 2 in accordance with FIG. 2. The use of a radiation source 3 having a lower étendue can have the effect that the radiation 14 in the region of the intermediate focus 25, as illustrated in FIG. 3, has a smaller spatial extent, but the same angular extent as in the illumination system in accordance with FIG. 2. This has the effect that although radiation 14 is applied to all of the field facets 23, the stop aperture 27 is only partly illuminated. Correspondingly, the individual pupil facets 24 are also only partly illuminated. There is no change in the number of pupil facets to which radiation 14 is applied and the averaged pupil filling.

The étendue of the illumination system 2 in the region of the entrance pupil, in particular in the region of the intermediate focus 25, can be expressed in terms of the numerical aperture and the size of the free aperture in this region. The numerical aperture of the entrance pupil, in particular in the region of the intermediate focus, can be at least 0.1, in particular at least 0.2, in particular at least 0.5. The entrance pupil, in particular the free aperture in the region of the intermediate focus, has in particular a diameter of at least 1 mm, in particular at least 3 mm, in particular at least 10 mm.

Aspects of the pupil facet mirror 18 are described below with reference to FIGS. 4 to 6. The pupil facet mirror 18 comprises a multiplicity of displaceable micromirrors 33. The micromirrors 33 are only illustrated schematically in the figures. In particular, they are not illustrated as true to scale. For details of the micromirrors 33 reference should be made to WO 2009/100856 A1 or DE 10 2008 009 600.8 and DE 10 2009 000 099.2. The micromirrors 33 are designed, in particular, as a so-called microelectromechanical system (MEMS). The micromirrors 33 are displaceable. They are pivotable in particular about at least one, preferably two, axes. The micromirrors 33 can be flexibly grouped to form the pupil facets 24. Groupings 34 that form the pupil facets 24 are indicated in FIGS. 4 to 6. Since the groupings 34 are flexibly variable, the pupil facets 24 have a flexibly settable geometrical design. In other words, the micromirrors 33 can be grouped to form pupil facets 24 having different geometrical designs. In this case, the geometrical design of a pupil facet 24 should be understood to mean the size, form and arrangement thereof on the pupil facet mirror 18. The geometrical design of the pupil facets 24 is therefore not fixedly predefined a priori. In other words, since the geometrical design of the pupil facets 24 can be flexibly adapted, during operation, to the requirements of the respective application and/or the properties of the other parts of the illumination system 2, in particular the characteristics of the radiation source 3, the pupil facets 24 formed by the micromirrors 33 are also designated as virtual pupil facets.

The illumination system 2 according to the invention makes it possible, in particular, to group the micromirrors 33 of the pupil facet mirror 18 to form pupil facets 24 in such a way that a predefined parameter of the illumination pupil lies in a predetermined range. It is possible, in particular, to group the micromirrors 33 to form pupil facets 24 in such a way that the transmission of the illumination system is maximized and/or a smallest possible part of the pupil is illuminated, e.g. a dipole having very small poles.

The advantages of the virtual pupil facets are described below on the basis of the methods for designing the illumination system 2. The flexible grouping of the micromirrors 33 to form the pupil facets 24 makes it possible, in particular, to adapt the étendue of the illumination system 2 to that of the radiation source 3. By varying the grouping of the micromirrors 33 it is possible, in particular, to set the étendue of the illumination system 2 during the operation of the illumination system 2. Moreover, by adapting the grouping of the micromirrors 33 to form pupil facets 24, it is possible to adapt the transmission and/or the pupil filling and/or a combination or balance between transmission and pupil filling to predefined boundary conditions. These illumination parameters can be optimized, in particular.

The illumination situation of the pupil facet mirror 18 as illustrated schematically in FIG. 4 substantially corresponds to that in accordance with FIG. 2. In this case, it was assumed that the illumination pupil has almost the same étendue as the radiation source 3. The micromirrors 33 are therefore grouped to form pupil facets 24 in such a way that the images of the radiation source 3 match the pupil facets 24 in each case substantially completely, in particular to the extent of at least 99%. This should be understood to mean that at least 99% of the total intensity of the illumination light transferred from a given field facet 23 to the pupil facet mirror 18 is incident on the pupil facet 24 assigned to the field facet 23. In order to clarify the intensity distribution of the images of the radiation source 3 in the region of the pupil facet mirror 18, FIGS. 4 to 6 schematically illustrate curves 35, 36 and 37 which correspond to the regions containing 70%, 90% and 99% of the total intensity of the image of the radiation source 3.

If, proceeding from the illumination setting illustrated in FIG. 4, it is desired to change over to one having an annular illumination pupil, it is possible to switch off the field facets 23 for which, in the case of this illumination setting, i.e. in the case of an annular illumination pupil, there are no free pupil facets on the pupil facet mirror 18. A field facet can be switched off by being displaced, in particular tilted, in such a way that the radiation 14 reflected from it does not impinge on a suitable, assigned pupil facet 24 of the pupil facet mirror 18, in particular does not impinge on the pupil facet mirror 18. As an alternative thereto, it is possible for the corresponding field facet 23 to be obscured, i.e. masked out.

As a result of a large number of field facets 23 being switched off, however, the transmission of the illumination system also decreases together with the étendue of the annular illumination pupil.

If the transmission of the illumination system is a crucial parameter, according to the invention provision is therefore made for minimizing the number of field facets 23 switched off. It has been recognized that it is more efficient to use only the brightest part of the phase space, instead of switching off a large number of the field facets 23. The illumination system 2 according to the invention makes it possible, in particular, to discard the edge of the plasma instead of switching off field facets 23. This should be understood to mean that an edge region of the image of the radiation source 3 on the pupil facet mirror 18 is discarded. This is achieved by grouping the micromirrors 33 to form pupil facets 24 in such a way that only a smaller portion of the total intensity of the image of the radiation source 3 matches an individual pupil facet 24. In other words, the micromirrors 33 are grouped to form pupil facets 24 of smaller size. In the case of the exemplary embodiment illustrated by way of example in FIG. 6, the size of the groupings 34, i.e. of the pupil facets 24, was reduced approximately by 50%. This had the consequence that the proportion of the total intensity of the radiation 14 of the image of the radiation source 3 that matched an individual pupil facet 24 was no longer 99%. However, the proportion of the total intensity of the image of the radiation source 3 that matches an individual pupil facet is still more than 90%. Consequently, the transmission of the illumination pupil illustrated in FIG. 6 is lower than that of the illumination pupil in accordance with FIG. 4 only by approximately 10%, since the number of virtual pupil facets can be kept almost constant despite the small area of the annulus in comparison with FIG. 4.

In addition or as an alternative to reducing the size of the virtual pupil facets 24, it is possible to assign only the brightest field facets 23 for transferring the illumination radiation 14 to the object field 5 to a virtual pupil facet 24 on the pupil facet mirror 18. In other words, it is possible to switch off individual field facets 23. This is advantageous, in particular, if the field facets 23 are not equally bright. In this case, it can be advantageous to switch off the darkest field facets 23.

Generally, there is no restriction to discarding the radiation 14 either on the field facets 23 or the pupil facets 24 and/or at the intermediate focus 25. It is possible, as required, to select the brightest region of the four-dimensional phase space or to discard the darkest region. This also holds true, in particular, if the illumination optical unit is constructed in the manner of a specular reflector. For details of such a specular reflector, reference should be made to WO 2004/092 844 A2.

Further aspects of the invention are described below in a brief summary.

One advantageous embodiment provides for the intermediate focus stop 26 to be of variable design. It can be adapted, in particular, to the size and/or form of the virtual pupil facet 24. It is possible, in particular, to adapt the intermediate focus stop 26 precisely in such a way that it transmits exclusively that portion of the illumination radiation 14 which matches the pupil facets 24 of a given grouping 34, while it masks out from the illumination optical unit 4 already on the input side the illumination radiation 14 discarded anyway in the region of the pupil facet mirror 18. For details of a variable stop 26 reference should be made, for example, to DE 10 2011 076 297.3.

Moreover, light undergoing crosstalk is prevented from leading to stray light by a variable stop. In order to prevent this, in addition or as an alternative to a variable embodiment of the intermediate focus stop 26, provision can be made for assigning the virtual pupil facets 24 to the field facets 23 in such a way that adjacent pupil facets 24 are not illuminated by adjacent field facets 23. It is advantageous, in particular, if adjacent pupil facets 24 are illuminated by field facets 23 which have a largest possible spacing. Provision can be made, in particular, for assigning the pupil facets 24 to the field facets 23 in such a way that adjacent pupil facets 24 are illuminated by field facets 23 which are spaced apart from one another by at least one, in particular at least two, in particular at least three, field facets 23.

Furthermore, it is possible for not only the size, but also the form of the virtual pupil facets 24 and/or of the intermediate focus stop 26 to be flexibly set, in particular adapted to the properties of the radiation source 3, in particular optimized.

In accordance with a further aspect of the invention, the arrangement of the virtual pupil facets 24 on the pupil facet mirror 18 can be set flexibly. The arrangement, i.e. the positioning of the individual pupil facets 24 can be adapted in particular to the form of the pupil facets 24.

A further aspect provides for grouping the micromirrors 33 in such a way that different pupil facets 24 of a given grouping have a different geometrical design. It is possible, in particular, for the pupil facets 24 that form a predefined illumination pupil to be designed with a different size and/or form. This makes it possible to adapt the size and/or form of the virtual pupil facets 24 to the respective images of the radiation source 3. According to the invention it has been recognized that these images can deviate from one another in terms of size and/or form.

Generally, it is possible to group the micromirrors 33 of the pupil facet mirror 18 to form pupil facets 24 of a predefined illumination pupil, in particular having a predefined étendue, wherein the geometrical design of the pupil facets 24 is chosen in a manner dependent on properties of the radiation source 3. In this case, crucial properties of the radiation source 3 can be its étendue, its intensity, in particular its intensity profile, in particular its homogeneity.

Advantageously, the field facet mirror 17 is also formed as an MEMS having a multiplicity of displaceable micromirrors 33. In this case, the geometrical design of the field facets 23 can also be flexibly set. This further increases the flexibility of the illumination system 2.

The concept according to the invention is described below on the basis of an alternative illumination setting with reference to FIGS. 8 to 13. Identical parts are given the same reference signs as in the previous exemplary embodiment, to the description of which reference is hereby made. The illumination system 2 in accordance with this exemplary embodiment comprises a field facet mirror 17 having 48 field facets. The field facets 23 can once again be designed monolithically or as groupings 34 of a multiplicity of micromirrors 33. They are once again displaceable, in particular tiltable, in particular switchable.

FIG. 8 illustrates by way of example a view of the pupil facet mirror 18 in which the micromirrors 33—not illustrated individually—are grouped to form pupil facets 24 forming a so-called dipole illumination setting. With reference to the xy coordinate system depicted for descriptive purposes, the illumination setting illustrated by way of example is also designated as an x-dipole.

The pupil facets 24 are virtual pupil facets, that is to say groupings 34 of the micromirrors 33 of the pupil facet mirror 18. In addition to the 70%, 90% and 99% regions 35, 36, 37, a boundary 40 of the pupil facets 24 is depicted in each case. The boundary 40 encloses the region of the image of the radiation source 3 on the pupil facet mirror 18.

The pupil facets 24 together with an associated one of the field facets 23 respectively form an illumination channel for guiding the EUV radiation 14 to the object field 5, in particular to the reticle 7.

FIG. 9 illustrates by way of example the intensity I of the illumination radiation 14 on the pupil facet mirror 18 along the line IX-IX. The total intensity of the illumination radiation 14 transferred to the object field 5 results from the total intensity of the intensity reflected by each individual one of the pupil facets 24 summed over all the pupil facets 24.

If a smaller pupil filling is intended to be set, it is possible to set, that is to say to displace or to switch, a specific selection of the field facets 23 in such a way that they no longer direct the illumination radiation 14 to the assigned pupil facet 24 and therefore no longer direct it into the object field 5. For details of such displacement or switchability of the field facets 23, reference should be made to WO 2011/154/244 A1.

It is possible, for example, to switch 75%, that is to say 36, of the field facets 23 in such a way that the illumination radiation 14 reflected by them is no longer guided to the pupil facet mirror 18. The illumination setting illustrated by way of example in FIG. 10 can be achieved as a result. This illumination setting has a pupil filling which is reduced by 75% in comparison with that of the illumination setting in accordance with FIG. 8. The associated intensity distribution on the pupil facet mirror 18 along the line XI-XI is illustrated in FIG. 11.

The number of pupil facets 24 used, that is to say the number of pupil facets 24 contributing to the illumination of the object field 5, has therefore decreased by a factor of four. It amounts to one quarter of the number of pupil facets 24 of the illumination setting in accordance with FIG. 8. In order to elucidate the principle, FIG. 10 also illustrates empty, that is to say switched-off, pupil facets 24 and the boundary 40 thereof. However, these do not contribute to the illumination of the object field 5. A targeted arrangement of the corresponding micromirrors 33, in particular a grouping thereof, can also be dispensed with.

Assuming that each of the pupil facets 24 makes a substantially identical contribution to the total intensity of the illumination of the object field 5, the illumination setting in accordance with FIG. 10 leads to a total intensity of the illumination of the object field 5 reduced by 75% in comparison with the illumination setting in accordance with FIG. 8. To put it another way, the reduction of the pupil filling assuming a locally constant intensity on the field facet mirror 17, that is to say an angle-independent intensity in an intermediate focus, leads to a light loss of 75%.

It has been recognized according to the invention that the light loss on account of the reduction of the pupil filling can be reduced and the total intensity of the illumination of the object field 5 can thus be increased by the micromirrors 33 of the pupil facet mirror 18 being regrouped. It has been recognized, in particular, that it is advantageous, for producing a smaller pupil filling, to regroup the micromirrors 33 of the pupil facet mirror 18 in such a way that smaller pupil facets 24 are used. A corresponding grouping is illustrated in FIG. 12, for example. The micromirrors 33 of the pupil facet mirror 18 are grouped to form pupil facets 24, in particular, in such a way that the size of the pupil facets 24 is smaller than the size of the images of the radiation source 3 on the pupil facet mirror 18. The pupil facets 24 have, in particular, a boundary 41 lying within the boundary 40 of the pupil facets 24 of the arrangement in accordance with FIG. 8. The boundary 41 lies at least partly, in particular completely, within the boundary 40. The pupil facets 24 have, in particular, an area corresponding to the area of the images of the radiation source 3 on the pupil facet mirror 18 in the range of 10% to 95%, in particular in the range of 15% to 80%, in particular in the range of 20% to 55%.

In the case of this grouping 34 of the micromirrors 33, that is to say in the case of a corresponding design of the pupil facets 24, part of the illumination radiation 14 guided from a field facet 23 to the pupil facet mirror 18 is incident in a region lying outside the pupil facet 23 respectively associated with the pupil facet 24, or outside the corresponding grouping 34 of the micromirrors 33. This portion of the intensity is represented by a dashed line in FIG. 13. This portion of the illumination radiation 14 is not guided into the object field 5. Consequently, it does not reach the used region of the reticle 7 and therefore does not contribute to the lithographic process.

Preferably, the portion is suitably deflected or blocked already before impinging on the pupil facet mirror 18. A stop, in particular a variable stop, is preferably provided for this purpose. The stop is preferably arranged in the region of an intermediate focus, in particular in the region of the intermediate focal plane 16. It is adjustable, in particular, in such a way that precisely the portion of the illumination radiation 14 which is incident in the region of the pupil facet mirror 18 outside the respective boundaries 41 of the pupil facets 24 is masked out. In this case, the intensity profile represented by the solid line in FIG. 13 arises in the region of the pupil facet mirror 18. In the case of the intensity profile, the intensity of the illumination channels is in each case cut off before it has fallen to a negligible value, in particular to zero. It is possible, in particular, to design the pupil facets 24 in such a way that they have an intensity profile having a specific minimum intensity. The minimum intensity can be in particular at least 5%, in particular at least 10%, in particular at least 15%, in particular at least 20%, of the maximum intensity of the illumination radiation 14 on the respective pupil facet 24.

Preferably, that part of the intensity profile which is to be masked out is determined as a function of the desired total transmission and/or of the desired degree of pupil filling.

In the case, too, of the configuration of the pupil facet mirror 18 in accordance with FIG. 12, that is to say a design of the pupil facets 24 which is smaller than the image of the radiation source 3 in the region of the pupil facet mirror 18, a loss of illumination radiation 14 occurs. However, this light loss is less than that in the case of an embodiment of the pupil facet mirror 18 in which each of the pupil facets 24 is of the same size as the image of the radiation source 3 in the region of the pupil facet mirror 18. The light loss in comparison with the embodiment in accordance with FIG. 8 can be in particular less than 50%, in particular less than 25%, in particular less than 10%. The light loss in the case of the embodiment in accordance with FIG. 12 relative to the embodiment in accordance with FIG. 8 is, in particular, lower than that in the case of the embodiment in accordance with FIG. 10 relative to the embodiment in accordance with FIG. 8. In other words, the embodiment in accordance with FIG. 12, in comparison with that in accordance with FIG. 10, leads to a higher total transmission with a comparable pupil, in particular with a comparable, in particular identical, pupil filling. The total transmission in the case of the embodiment in accordance with FIG. 12 is in particular at least 10% greater, in particular at least 25% greater, in particular at least 50% greater, in particular at least 100% greater, than that in the case of the embodiment in accordance with FIG. 10.

In many cases, the local profile of the illumination in the intermediate focus can be approximated by a Gaussian distribution. In this case, the stop in the intermediate focus and accordingly the size of the pupil facets 24 can be chosen in such a way that a predefined minimum portion of the illumination radiation 14 is guided from the pupil facets 24 to the reticle 7. Provision can be made, in particular, for example, for choosing the size of the pupil facets 24 in such a way that the boundary 41 precisely corresponds to the "3σ value" of the intensity distribution. This means that the size corresponding to the "3σ value" of the intensity distribution would then be used as the size of the image of the radiation source 3 in the region of an intermediate focus stop 16.

Furthermore, the size of the pupil facets 24 can be adapted to the stop 26 in the region of the intermediate focal plane 16. By way of the design of the stop 26 in the region of the intermediate focal plane 16, it is possible to influence the size of the image of the radiation source 3 in the region of the pupil facet mirror 18. For this purpose it is advantageous, in particular, to design the stop 26 in a variable fashion, in particular with a settable size of the stop aperture. The size of the pupil facets 24 is preferably set in such a way that it is at most of the same size as the size of the image of the radiation source 3 in the region of the pupil facet mirror 18. The size of the pupil facets 24 is, in particular, smaller than the size of the image. It is in particular at most 95%, in particular at most 80%, in particular at most 50%, of the size of the image. In this case, the size should be understood to mean, in particular, the area of the image. However, the size of the pupil facets 24 can correspondingly be defined relative to the diameter of the image of the radiation source 3 in the region of the pupil facet mirror 18.

The advantages of the reduction of the size of the individual pupil facets 24 with regard to the total transmission of the illumination system 2 are illustrated schematically in FIG. 14. With the use of a radiation source 3 having a specific étendue and a given collector 15, there is an extremely small pupil filling which can be set without loss of light. This pupil filling is used for scaling the horizontal axis in FIG. 14. A smaller pupil filling necessarily leads to a reduction of the total transmission, which is illustrated as relative light loss on the vertical axis in FIG. 14. While the dashed line illustrates the situation where the reduced pupil filling is achieved by switching off predefined pupil facets 24, which leads to a corresponding light loss, the solid line illustrates the effects of the solution according to the invention. The adaptation of the size of the pupil facets 24, as provided according to the invention, leads, in particular, to a significantly reduced light loss, that is to say to a greater total transmission. By way of example, it is possible to achieve a halving of the pupil filling before a significant reduction of the transmission, in particular a reduction of the transmission by more than 5%, commences.

Further advantageous aspects and alternatives of the invention are described below. A limitation of the size of the pupil facets 23 leads to a particular advantageous result when the local dependence of the intensity of the illumination radiation 14 in an intermediate focal plane 16 is as strongly pronounced as possible, in particular has very long tails, whereas the angle dependence is only weakly pronounced, particularly if the intensity is constant as far a specific limit angle and then falls very rapidly to zero.

A desirable aim for the illumination system 2 is a homogeneous illumination of the field facet mirror 17, that is to say an angle-independent illumination in the intermediate focal plane 16. In practice, however, an angle dependence of the illumination in the intermediate focal plane 16 can occur. The intensity distribution of the illumination radiation 14 in the intermediate focal plane 16, is, in particular, a function of location and angle in the intermediate focus, that is to say a function of two location variables x, y and two angle variables a, b. The location variables in the intermediate focus in this case correspond to the size of the pupil facets 24. The angle coordinates in the intermediate focus in this case correspond to the illuminated region on the field facet mirror 17.

In the case of the above-described reduction of the size of the pupil facets 24, the phase space in the intermediate focus is limited, in particular trimmed, with respect to the location variables. This can be achieved via the stop 26, for example.

By switching off field facets 23 it is possible to limit, in particular trim, the phase space in the intermediate focus with respect to the angle variables. This is advantageous particularly if the intensity distribution of the illumination radiation 14 in the intermediate focus has an angle dependence.

On the basis of the intensity distribution in the intermediate focus as a function of the location and angle variables, I=I(x, y, a, b), for a predefined degree of pupil filling, it is possible to determine an optimum of the configuration of the field facet mirror 17 and/or of the pupil facet mirror 18. It is possible, in particular, to optimize the field facet mirror 17 and/or the pupil facet mirror 18 with regard to as little loss of light as possible, that is to say with regard to the highest possible total transmission. Since the form and/or size of the field facets 23 is predefined by the form and/or size of the object field 5 to be illuminated and the imaging scale of the illumination optical unit 4, with regard to the field facets 23 the number of which, in particular, is optimized. The number of pupil facets 24 can then be chosen precisely such that exactly one pupil facet 24 is assigned to each field facet 23. As described above, in particular the size of the pupil facets 24 is adapted for the purpose of optimizing the total transmission. The advantages of the invention can be further improved by the adaptation of the number of field facets 23 used. It is possible, in particular, to further increase the total transmission for degrees of pupil filling of less than 20%.

FIG. 15 shows an illustration of an intensity distribution in the intermediate focus as a function of the location and angle variables, I=I(x, y, a, b). Only one spatial coordinate x and one angle coordinate a are illustrated in this case. The lines designated by I=const are the isolines of the intensity distribution. In this illustration, a reduction in the size of the pupil facets 24 corresponds to the fact that only a restricted region is used parallel to the horizontal axis. FIG. 15 schematically illustrates a boundary 42 of the phase space used. The boundary 42 is rectangular in accordance with the exemplary embodiment illustrated, the width of the rectangle corresponding to the chosen size of the pupil facet 24. The used region of the field facet mirror 17 corresponds to the height of the rectangle.

A further exemplary embodiment of the invention is described below with reference to FIGS. 16 and 17. Identical parts are given the same reference signs as in the exemplary embodiments in accordance with FIGS. 8 and 12, to the description of which reference is hereby made. In this exemplary embodiment, provision is made for designing the individual pupil facets 24 with different sizes. The groupings 34 comprise, in particular, different numbers of micromirrors 33. In this case, provision is made, in particular, for assigning larger pupil facets 24 to field facets having a higher intensity. Field facets 23 having a lower intensity are assigned to smaller pupil facets 24. FIG. 16 illustrates merely by way of example an embodiment in which two of the pupil facets 24 occupy a larger area on the pupil facet mirror 18 than the remaining pupil facets 24. It is also possible to individually set the size of all the pupil facets 24. The size of the pupil facets 24 can be selectable in particular in a manner dependent on the intensity transmitted by the associated field facet 23.

FIG. 17 once again illustrates the associated intensity profile of the illumination radiation 14 on the pupil facet mirror 18 along the line XVII-XVII.

Expressed in coordinates of the phase space, the design in accordance with FIG. 16 has the effect that the used phase space in the region of the intermediate focus 16 is not an orthogonal four-dimensional parallel polytope. The boundary 42' of the phase space is not rectangular in this case. It is delimited firstly by an isoline I=const.* and secondly by parallel boundaries of the angle coordinates a, $a=a_1$, $a=a_2$. FIG. 18 shows, in a manner analogous to FIG. 15, an intensity distribution in the intermediate focus as a function of the location and angle variables, I=I(x, y, a, b). The best possible transmission for a predefined pupil filling, or the smallest possible pupil filling for a predefined transmission, is obtained if the edge of the used region of the phase space lies along an isoline I=const* in the depicted image. If not just two but all four variables on which I(x, y, a, b) is dependent are considered, then this involves a three-dimensional iso-area in a four-dimensional phase space. If the intensity distribution I(x, y, a, b) in the intermediate focus 16 has no local minima, then the region of the phase space thus determined is simply connected and can be at least approximated by the setting of field facets 23 and pupil facets 24. In the case of the boundary 42' of the phase space in accordance with FIG. 18, smaller pupil facets 28 would be assigned to field facets 23 corresponding to the upper and respectively lower edge of the illustrated region of the phase space than would be assigned to the field facets therebetween.

The setting of the field facets 23 and/or of the pupil facets 24 can be determined in particular with the aid of an optimization method. In this case, an absolute optimum need not necessarily be determined. The optimization method can be terminated when a predefined criterion is reached.

The arrangement and design according to the invention of the field facets 23 and of the pupil facets 24 is advantageous in particular for a so-called fly's eye condensor. In the latter, the image of the radiation source 3 in the intermediate focus is imaged onto an assigned pupil facet 24 in each case by one of the field facets 23. Furthermore, the pupil facet 24 respectively images the assigned field facet 23 onto the entire reticle 7. The field facets 23 are situated as it were in the far field of the intermediate focus 16.

The invention is likewise applicable to a so-called specular reflector. In the case of such a reflector, although the second faceted element likewise images individual groups on the first faceted element onto the reticle 7, the groups do not necessarily have the same form as the reticle 7. It is possible that the image of such a group does not cover the entire reticle 7. In the case of a specular reflector, the pupil facets 24 are replaced by regions on the second faceted element. Correspondingly, the used regions of the first faceted element replace the field facets 23, in particular occur instead of the number thereof.

The size of the used region on the second faceted region can be chosen independently for each such group. If the image of such a group does not cover the entire reticle 7, in a specific region of the radiation 14 it is possible to arrange more of such groups than field facets 23 could be arranged there. Each of the groups accordingly guides a smaller phase space volume of illumination radiation 14.

As has already been shown on the basis of the exemplary embodiments in accordance with FIG. 6, it is expedient for those pupil facets 24 which are assigned to field facets 23 having above average intensity to be chosen to be larger. On account of the finite sizes of a field facet 23, the chosen size of the pupil facet 24 arises as a compromise concerning the spatially different properties of the illumination radiation 14 over the area of the field facet 23. The smaller the region on the first faceted element regarding which the size of the used assigned region on the second faceted element arises as a compromise, the fewer compromises have to be undertaken, i.e. the less light or pupil filling is lost.

FIG. 19 shows, in a manner analogous to FIG. 18, an intensity distribution I(x, y, a, b) in the intermediate focus 16, only the dependence on the angle variables a and b being illustrated. These variables correspond, at least approximately, to coordinates on the field facet mirror 17. By way of example, the approximate positions of two field facets $23_1$ and $23_2$ are depicted, i.e. the corresponding region of the phase space is guided via the corresponding field facet. Over the region of an individual field facet $23_1$, $23_2$, a significant variation of the intensity and thus also of the optimum size of the assigned pupil facets $24_1$, $24_2$ occurs. The actual size of the assigned pupil facets $24_1$, $24_2$ can therefore only be a compromise of the different requirements.

FIG. 20 shows an analogous drawing for a specular reflector. The regions $23'_1$, $23'_2$, $23'_3$, . . . on the first faceted element are designed to be smaller than in the case of a fly's eye condensor. Accordingly, the variation of the intensity distribution over a region is smaller, and accordingly so is the optimum size of the assigned regions on the second faceted element. The size of the assigned regions on the second faceted element therefore has to mediate between conflicting requirements to a lesser extent.

During the use of the projection exposure apparatus 1, the reticle 7 and the wafer 12, which bears a coating that is light-sensitive to the illumination light 14, are provided. Afterward, at least one section of the reticle 7 is projected onto the wafer 12 with the aid of the projection exposure apparatus 1. During the projection of the reticle 7 onto the wafer 12, the reticle holder 8 and/or the wafer holder 13 can be displaced in a direction parallel to the object plane 6 and/or parallel to the image plane 11, respectively. The displacement of the reticle 7 and of the wafer 12 can preferably be effected synchronously with one another. Finally, the light-sensitive layer on the wafer 12 exposed with the illumination light 14 is developed. In this way, a micro- or nanostructured component, in particular a semiconductor chip, is produced.

The invention claimed is:

1. An illumination optical unit configured to transfer illumination radiation having a predefined intensity distribution in an intermediate focal plane from the intermediate focal plane to an object field along a beam path, the illumination optical unit comprising:
   a first faceted element; and
   a second faceted element downstream of the first faceted element along the beam path, the second faceted element comprising a multiplicity of displaceable micromirrors that are groupable to define facets in a variably flexible manner, wherein the displaceable micromirrors are grouped to define facets so that, during use of the illumination optical unit:

an intensity distribution on at least one facet has a minimum ($I_{min}$) and a maximum ($I_{max}$), and $I_{min} \geq 0.05\ I_{max}$; and at least 5% of the illumination radiation does not contribute to illumination of the object field.

2. The illumination optical unit of claim 1, wherein the micro mirrors are groupable to define facets of different illumination pupils.

3. The illumination optical unit of claim 2, wherein different illumination pupils have different étendues.

4. The illumination optical unit of claim 2, wherein different illumination pupils have different transmissions.

5. The illumination optical unit of claim 2, wherein different illumination pupils have different pupil fillings.

6. The illumination optical unit of claim 1, wherein the groupable micromirrors are grouped so that different facets of a grouping have a different geometrical design.

7. The illumination optical unit of claim 1, wherein the facets of the first faceted element are displaceable.

8. The illumination illumination optical unit of claim 1, wherein $I_{min} \geq 0.10\ I_{max}$.

9. The illumination illumination optical of claim 1, wherein $I_{min} \geq 0.15\ I_{max}$.

10. An illumination optical system, comprising:
a radiation source; and
an illumination optical unit according to claim 1.

11. The illumination optical system of claim 10, wherein the groupable micromirrors are grouped to define facets of an illumination pupil having an étendue.

12. The illumination optical system of claim 11, wherein a geometrical design of the facets is based on properties of the radiation source.

13. The illumination optical system of claim 10, further comprising a stop, wherein a size and/or a form of the stop is adapted to the size and/or form of the facets.

14. The illumination optical system of claim 10, wherein the facets have a size which is smaller than a size of an image of the radiation source on the second faceted element.

15. The illumination optical system of claim 10, wherein a totality of regions of the first faceted element configured to guide illumination radiation into an object field has a size which is smaller than a size of a region illuminatable by the radiation source on the first faceted element.

16. The illumination optical system of claim 10, further comprising a stop in a region of the intermediate focal plane, and the stop has a radiation-transmissive region which is smaller than a size of an image of the radiation source in the region of the intermediate focal plane.

17. The illumination optical system of claim 10, wherein, during use of the illumination system, facets that illuminate an object field contribute to the illumination of the object field that so that the contribution of two arbitrary facets deviates from each other by at most 10%.

18. The illumination optical system of claim 10, wherein the micromirrors are grouped so that the étendue in the beam path downstream of the second faceted element is at least 5% less than the étendue in the beam path upstream of the second faceted element.

19. An apparatus, comprising:
an illumination optical unit according to claim 1;
a radiation source configured to generate the illumination radiation; and
a projection optical unit,
wherein the apparatus is a microlithography projection exposure apparatus.

20. A method of using a microlithography projection exposure apparatus which comprises a radiation source, an illumination optical system and a projection optical system, the method comprising:

using the illumination optical system to illuminate a reticle; and using the projection optical system to project at least a portion of the illuminated reticle onto a light-sensitive material, wherein the illumination optical system is an illumination optical unit according to claim 1, and the radiation source is configured to generate the illumination radiation.

21. A method, comprising:
providing a microlithography projection exposure apparatus comprising an illumination optical unit according to claim 1, a radiation source configured to generate the illumination radiation, and a projection optical system;
predefining an illumination pupil having an étendue;
predefining at least one parameter to be adapted to the illumination pupil;
grouping at least some of the micromirrors of the second faceted element to form facets,
wherein:
in each case one of the facets is assigned to a facet of the first faceted element so that illumination radiation from a radiation source is applied to it via the respective facet;
the micromirrors are grouped to form facets so that the parameter to be adapted lies in a predetermined range;
the illumination parameter to be adapted is the transmission and/or pupil filling; and
for adapting the illumination parameter, the number and/or size and/or arrangement of the facets are/is chosen.

22. A method according to claim 21, wherein an étendue of the predefined illumination pupil is lower than an étendue of the radiation source.

23. The illumination optical unit of claim 1, wherein the at least 5% of the illumination radiation that does not contribute to illumination of the object field is a phase space region of the illumination radiation having the lowest intensity.

* * * * *

UNITED STATES PATENT AND TRADEMARK OFFICE
CERTIFICATE OF CORRECTION

| | | |
|---|---|---|
| PATENT NO. | : 9,891,530 B2 | Page 1 of 1 |
| APPLICATION NO. | : 14/567645 | |
| DATED | : February 13, 2018 | |
| INVENTOR(S) | : Martin Endres and Michael Patra | |

It is certified that error appears in the above-identified patent and that said Letters Patent is hereby corrected as shown below:

In the Specification

Column 5, Line 30: Delete "$I_{min}$," and insert -- $I_{min}$ --, therefor.

Column 7, Line 26: Delete "four-dimensational" and insert -- four-dimensional --, therefor.

Column 17, Line 52: Delete "condensor." and insert -- condenser. --, therefor.

Column 18, Line 38: Delete "condensor." and insert -- condenser. --, therefor.

In the Claims

Column 19, Line 26: In Claim 8, delete "illumination illumination" and insert -- illumination --, therefor.

Column 19, Line 28: In Claim 9, delete "illumination illumination" and insert -- illumination --, therefor.

Signed and Sealed this
First Day of May, 2018

Andrei Iancu
*Director of the United States Patent and Trademark Office*